(12) United States Patent
Yu et al.

(10) Patent No.: US 11,777,511 B2
(45) Date of Patent: Oct. 3, 2023

(54) LINEARIZATION OF DIGITAL-TO-ANALOG CONVERTERS (DACS) AND ANALOG-TO-DIGITAL CONVERTERS (ADCS) AND ASSOCIATED METHODS

(71) Applicant: Mixed-Signal Devices Inc., Irvine, CA (US)

(72) Inventors: Tommy Yu, Orange, CA (US); Avanindra Madisetti, Coto De Caza, CA (US)

(73) Assignee: Mixed-Signal Devices Inc., Irvine, CA (US)

( * ) Notice: Subject to any disclaimer, the term of this patent is extended or adjusted under 35 U.S.C. 154(b) by 154 days.

(21) Appl. No.: 17/474,677

(22) Filed: Sep. 14, 2021

(65) Prior Publication Data

US 2022/0006465 A1 Jan. 6, 2022

Related U.S. Application Data

(63) Continuation of application No. PCT/US2020/022857, filed on Mar. 14, 2020.
(Continued)

(51) Int. Cl.
*H03M 1/66* (2006.01)
*H03M 1/06* (2006.01)

(52) U.S. Cl.
CPC ....... *H03M 1/0612* (2013.01); *H03M 1/0675* (2013.01)

(58) Field of Classification Search
CPC ...... H03M 3/502; H03M 1/74; H03M 1/0673; H03M 1/747; H03M 3/464; H03M 1/0612;
(Continued)

(56) References Cited

U.S. PATENT DOCUMENTS 4,499,594 A 2/1985 Lewinter
5,955,980 A 9/1999 Hanna
(Continued)

FOREIGN PATENT DOCUMENTS

CN 113796013 A 12/2021
EP 3939167 A1 1/2022
(Continued)

OTHER PUBLICATIONS

International Preliminary Report on Patentability for International Application PCT/US2020/022857, dated Aug. 25, 2021, dated Sep. 23, 2021, 6 Pgs.
(Continued)

*Primary Examiner* — Linh V Nguyen
(74) *Attorney, Agent, or Firm* — KPPB LLP

(57) ABSTRACT

Systems and methods for processing and storing digital information are described. One embodiment includes a method for linearizing digital-to-analog conversion including: receiving an input digital signal; segmenting the input digital signal into several segments, each segment being thermometer-coded; generating a redundant representation of each of the several segments, defining several redundant segments; performing a redundancy mapping for the several segments, defining redundantly mapped segments; assigning a probabilistic assignment for redundantly mapped segments; converting each redundantly mapped segment into an analog signal by a sub-digital-to-analog converter (DAC); and combining the analog signals to define an output analog signal.

16 Claims, 13 Drawing Sheets

Related U.S. Application Data

(60) Provisional application No. 62/818,238, filed on Mar. 14, 2019.

(58) Field of Classification Search
CPC .... H03M 1/066; H03M 1/0665; H03M 1/067; H03M 1/46; H03M 1/687; H03M 3/50; H03M 7/165; H03M 1/66; H03M 1/742; H03M 1/806
USPC .................................. 341/141, 140, 144, 153
See application file for complete search history.

(56) References Cited

U.S. PATENT DOCUMENTS

| | | | |
|---|---|---|---|
| 6,570,521 B1 | 5/2003 | Schofield | |
| 6,577,261 B2 | 6/2003 | Brooks et al. | |
| 6,614,377 B1 * | 9/2003 | Adams | H03M 1/0665 341/155 |
| 6,614,813 B1 | 9/2003 | Dudley et al. | |
| 6,624,774 B2 * | 9/2003 | Takeda | H03M 3/346 341/143 |
| 6,697,004 B1 * | 2/2004 | Galton | H03M 1/066 341/143 |
| 6,707,404 B1 | 3/2004 | Yilmaz | |
| 6,795,003 B2 * | 9/2004 | Wang | G06F 7/762 341/143 |
| 6,819,276 B1 * | 11/2004 | Hossack | H03M 1/0673 341/143 |
| 6,867,721 B1 * | 3/2005 | Lin | H03M 1/0673 341/150 |
| 7,209,063 B2 * | 4/2007 | Sekimoto | H03K 3/84 341/143 |
| 7,304,593 B2 * | 12/2007 | Luecking | H03M 1/0668 341/143 |
| 7,679,539 B2 * | 3/2010 | Lee | H03M 1/0673 341/120 |
| 9,065,480 B1 | 6/2015 | Tseng | |
| 9,124,287 B1 * | 9/2015 | Ho | H03M 1/109 |
| 9,413,394 B1 * | 8/2016 | Lye | H04B 1/0014 |
| 9,425,814 B1 | 8/2016 | Verma | |
| 10,530,372 B1 | 1/2020 | Yu et al. | |
| 11,405,045 B2 | 8/2022 | Yu et al. | |
| 2005/0003785 A1 | 1/2005 | Jackson et al. | |
| 2010/0265112 A1 * | 10/2010 | Ek | H03M 1/662 341/144 |
| 2019/0058482 A1 | 2/2019 | Inoue et al. | |
| 2019/0280704 A1 | 9/2019 | Bodnar et al. | |
| 2022/0085823 A1 | 3/2022 | Yu et al. | |
| 2022/0252694 A1 | 8/2022 | Yu et al. | |

FOREIGN PATENT DOCUMENTS

| | | |
|---|---|---|
| HK | 40064766 A | 7/2022 |
| WO | 2020186255 A1 | 9/2020 |
| WO | 2022170351 A1 | 8/2022 |

OTHER PUBLICATIONS

International Search Report and Written Opinion for International Application No. PCT/US2022/070536, Search completed Mar. 18, 2022, dated Apr. 1, 2022, 12 Pgs.

International Search Report and Written Opinion for International Application No. PCT/US2020/022857, Search completed May 18, 2020, dated Jun. 15, 2020, 8 Pgs.

Gomez-Garcia et al., "Linear Chirp Generator Based on Direct Digital Synthesis and Frequency Multiplication for Airborne FMCW Snow Probing Radar", 2014 IEEE MTT-S International Microwave Symposium (IMS2014), 4 pgs. Retrieved on Mar. 12, 2022 from <https://ieeexplore.ieee.org/document/6848668>.

Park et al. "Adaptive Digital-Predistortion Linearization of Frequency Multipliers", IEEE Transactions on Microwave Theory and Techniques, Dec. 2003, vol. 51, No. 12, pp. 2516-2522. Retrieved on Mar. 12, 2022 from <https://ieeexplore.ieee.org/abstract/document/1256784>.

Pateti et al., "Chirp Signal Generator Based on Direct Digitalsynthesizer (Dds) for A Radar At 300 Ghz", International Journal of Innovative Technology and Exploring Engineering (IJITEE), Sep. 2019, ISSN: 2278-3075, vol. 8, No. 11S2. pp. 54-60, retrieved on Mar. 12, 2022 from <https://www.ijitee.org/wpcontent/uploads/papers/v8i11S2/K101009811S219.pdf>.

Extended European Search Report for European Application No. 20770134.3, Search completed Dec. 16, 2022, dated Jan. 2, 2023, 12 Pgs.

Sun, "High-Order Mismatch-Shaped Segmented Multibit $\Delta\Sigma$ DACs with Arbitrary Unit Weights", IEEE Transactions on Circuits and Systems—1: Regular Papers IEEE, US, Feb. 2012, vol. 59, No. 2, pp. 295-304, XP011394669, ISSN: 1549-8328, DOI: 10.1109/TCSI.2011.2163970.

\* cited by examiner

LINEARIZATION OF DIGITAL-TO-ANALOG CONVERTERS (DACS) AND ANALOG-TO-DIGITAL CONVERTERS (ADCS) AND ASSOCIATED METHODS

CROSS REFERENCE TO RELATED APPLICATIONS

This application is a continuation of PCT Patent Application No. PCT/US2020/022857, entitled "Linearization of Digital-to-Analog Converters (DACs) and Analog-to-Digital Converters (ADCs) and Associated Methods" to Yu et al., filed Mar. 14, 2020, which claims priority to U.S. Provisional Application No. 62/818,238, entitled "Linearization of Digital-to-Analog Converters (DACs) and Analog-to-Digital Converters (ADCs) and Associated Methods" to Yu et al., filed Mar. 14, 2019, the disclosures of which are incorporated herein by reference in their entirety.

FIELD OF THE INVENTION

The present invention relates to systems and methods for reducing nonlinearity in digital-to-analog converters (DACs) and analog-to-digital converters (ADCs) using redundancy mapping.

BACKGROUND

Modern electronic systems process and store information digitally. However, due to the analog nature of the world, conversions between analog and digital domains are typically needed and performed by data converters. Analog-to-digital converters (ADCs) are used to convert analog signals (voltage, current, etc.) into digital codewords. On the other hand, digital-to-analog converters (DACs) are used to convert digital codewords into analog signals (voltage, current, etc.).

A DAC is a device that converts a fine-precision digital-format number (typically a finite-length binary format number) to an analog electrical quantity (such a voltage, current or electric charge). To construct an analog signal, there are two basic types of DAC output format: non-return-to-zero (NRZ) and return-to-zero (RZ). As shown in FIG. 1, for NRZ, the DAC updates its analog output according to its digital input at a fixed time interval of Ts and holds the output, where Ts is called updating and sampling period. For RZ, after updating the output at each time interval Ts, the DAC holds the output only for a certain time (Th), then goes back to zero. In both cases, the DAC's output is held for a certain time Th, where $0 < Th <= Ts$, known as zero-order-hold. The output of a DAC is typically a stepwise or pulsed analog signal and can be low-pass filtered to construct the desired analog signal as shown in FIG. 1.

Deviations of actual DAC output f(x) from the ideal DAC output may be characterized by the following metrics, for example: 1) Offset and gain errors; 2) Differential non-linearity (DNL); 3) Integral non-linearity (INL); 4) Spurious Free Dynamic Range (SFDR); and 5) Signal-to-noise ratio (SNR).

The offset error of a DAC is defined as the deviation of the linearized transfer curve of the DAC output from the ideal zero. The linearized transfer curve is based on the actual DAC output, either a simple min-max line connecting the minimal and the maximal DAC output value or a best-fit line of the all the output values of the DAC. Since the offset and gain errors do not introduce non-linearity, they have no effect on the spectral performance of DACs.

The differential non-linearity (DNL) is defined as the deviation of the actual step size from the ideal step size (LSB) between any two adjacent digital output codes, which can be referred to as its ideal size (1 LSB). Thus, DNL results in unequal step sizes in the transfer function. Integral non-linearity (INL) is defined as the deviation of the actual DAC output from the linearized transfer curve at every code as shown in FIG. 2. INL is also described as the accumulation of previous DNL errors. To assure monotonicity, the conditions DNL<0.5 LSB and INL<1 LSB have to be satisfied.

The Spurious Free Dynamic Range (SFDR) is a measure of the non-linearity of a DAC and is the ratio of a single tone being generated to the highest unwanted component in the Nyquist band. SFDR is typically expressed in decibels (dB).

Signal-to-Noise Ratio (SNR) is defined as the ratio of the power of the measured output signal to the integrated power of the noise floor in the Nyquist band ([0, sample frequency/2], except DC and harmonics). The value of SNR is also typically expressed in decibels (dB).

This background information is provided to reveal information believed by the applicant to be of possible relevance to the present invention. No admission is necessarily intended, nor should be construed, that any of the preceding information constitutes prior art against the present invention.

SUMMARY OF THE INVENTION

Systems and methods for linearizing digital-to-analog conversion using redundancy mapping are described. One embodiment includes a method for linearizing digital-to-analog conversion, including: receive, at a digital-to-analog converter (DAC) an input digital word; decompose the input digital word into several segments; generate a redundant representation of each of the several segments; generate a redundant mapping of the redundant representation of each of the several segments, defining several redundantly mapped segments; assigning a first probability for selecting the several segments; assigning a second probability for selecting the several redundantly mapped segments; selecting, with the first probability, the several segments and, with the second probability, the several redundantly mapped segments; converting the selected segments into analog signals by several sub-DACs; and combining the analog signals to define an output analog signal.

In a further embodiment, the method includes selecting between several mappings with probabilities of each mapping determined based on a number of bits of the DAC.

In still a further embodiment, performing the redundancy mapping includes performing a recursive redundancy mapping sequentially over pairs of segments.

In still a further embodiment, each intermediate segment undergoes two mappings x_k→u_k→v_k, with a first mapping as a most-significant-bit (MSB) segment and a second mapping as a least significant bit (LSB) segment of a two-segment pair.

In still a further embodiment again, a resolution of an MSB sub-DAC is unchanged and a resolution of all other sub-DACs is increased by at least one bit.

In still a further embodiment again, the DAC is a B-bit binary DAC with B binary weighted elements.

In still a further embedment again, each of the several segments is thermometer-coded.

In yet a further embodiment, each of the several segments is converted into an analog signal with a sub-DAC, where a resolution of each sub-DAC associated with intermediate segment pairs is at least one bit greater than the resolution of a sub-DAC for a first segment pair.

In still a further embodiment, the DAC is at least one DAC selected from the group consisting of a binary DAC, a thermometer coded DAC, a dynamic element matching (DEM) DAC, and a segmented DAC.

The present invention will now be described more fully hereinafter with reference to the accompanying drawings, in which preferred embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Those of ordinary skill in the art realize that the following descriptions of the embodiments of the present invention are illustrative and are not intended to be limiting in any way. Other embodiments of the present invention will readily suggest themselves to such skilled persons having the benefit of this disclosure. Like numbers refer to like elements throughout.

Before describing the present disclosure in detail, it is to be understood that this disclosure is not limited to parameters of the particularly exemplified systems, methods, apparatus, products, processes, and/or kits, which may, of course, vary. It is also to be understood that the terminology used herein is only for the purpose of describing particular embodiments of the present disclosure, and is not necessarily intended to limit the scope of the disclosure in any particular manner. Thus, while the present disclosure will be described in detail with reference to specific embodiments, features, aspects, configurations, etc., the descriptions are illustrative and are not to be construed as limiting the scope of the claimed invention. Various modifications can be made to the illustrated embodiments, features, aspects, configurations, etc. without departing from the spirit and scope of the invention as defined by the claims. Thus, while various aspects and embodiments have been disclosed herein, other aspects and embodiments are contemplated.

Unless defined otherwise, all technical and scientific terms used herein have the same meaning as commonly understood by one of ordinary skill in the art to which the present disclosure pertains. While a number of methods and materials similar or equivalent to those described herein can be used in the practice of the present disclosure, only certain exemplary materials and methods are described herein.

Various aspects of the present disclosure, including devices, systems, methods, etc., may be illustrated with reference to one or more exemplary embodiments or implementations. As used herein, the terms "embodiment," "alternative embodiment" and/or "exemplary implementation" means "serving as an example, instance, or illustration," and should not necessarily be construed as preferred or advantageous over other embodiments or implementations disclosed herein. In addition, reference to an "implementation" of the present disclosure or invention includes a specific reference to one or more embodiments thereof, and vice versa, and is intended to provide illustrative examples without limiting the scope of the invention, which is indicated by the appended claims rather than by the following description.

It will be noted that, as used in this specification and the appended claims, the singular forms "a," "an" and "the" include plural referents unless the content clearly dictates otherwise. Thus, for example, reference to a "sensor" includes one, two, or more sensors.

As used throughout this application the words "can" and "may" are used in a permissive sense (i.e., meaning having the potential to), rather than the mandatory sense (i.e., meaning must). Additionally, the terms "including," "having," "involving," "containing," "characterized by," variants thereof (e.g., "includes," "has," and "involves," "contains," etc.), and similar terms as used herein, including the claims, shall be inclusive and/or open-ended, shall have the same meaning as the word "comprising" and variants thereof (e.g., "comprise" and "comprises"), and do not exclude additional, un-recited elements or method steps, illustratively.

Various aspects of the present disclosure can be illustrated by describing components that are coupled, attached, connected, and/or joined together. As used herein, the terms "coupled", "attached", "connected," and/or "joined" are used to indicate either a direct connection between two components or, where appropriate, an indirect connection to one another through intervening or intermediate components. In contrast, when a component is referred to as being "directly coupled", "directly attached", "directly connected," and/or "directly joined" to another component, no intervening elements are present or contemplated. Thus, as used herein, the terms "connection," "connected," and the like do not necessarily imply direct contact between the two or more elements. In addition, components that are coupled, attached, connected, and/or joined together are not necessarily (reversibly or permanently) secured to one another. For instance, coupling, attaching, connecting, and/or joining can comprise placing, positioning, and/or disposing the components together or otherwise adjacent in some implementations.

As used herein, directional and/or arbitrary terms, such as "top," "bottom," "front," "back," "left," "right," "up," "down," "upper," "lower," "inner," "outer," "internal," "external," "interior," "exterior," "proximal," "distal" and the like can be used solely to indicate relative directions and/or orientations and may not otherwise be intended to limit the scope of the disclosure, including the specification, invention, and/or claims.

Where possible, like numbering of elements have been used in various figures. In addition, similar elements and/or elements having similar functions may be designated by similar numbering. Furthermore, alternative configurations of a particular element may each include separate letters appended to the element number. Accordingly, an appended letter can be used to designate an alternative design, structure, function, implementation, and/or embodiment of an element or feature without an appended letter. Similarly, multiple instances of an element and or sub-elements of a parent element may each include separate letters appended to the element number. In each case, the element label may be used without an appended letter to generally refer to instances of the element or any one of the alternative elements. Element labels including an appended letter can be used to refer to a specific instance of the element or to distinguish or draw attention to multiple uses of the element. However, element labels including an appended letter are not meant to be limited to the specific and/or particular embodiment(s) in which they are illustrated. In other words, reference to a specific feature in relation to one embodiment should not be construed as being limited to applications only within the embodiment.

It will also be appreciated that where a range of values (e.g., less than, greater than, at least, and/or up to a certain value, and/or between two recited values) is disclosed or recited, any specific value or range of values falling within the disclosed range of values is likewise disclosed and contemplated herein.

It is also noted that systems, methods, apparatus, devices, products, processes, compositions, and/or kits, etc., according to certain embodiments of the present invention may include, incorporate, or otherwise comprise properties, features, aspects, steps, components, members, and/or elements described in other embodiments disclosed and/or described herein. Thus, reference to a specific feature, aspect, steps, component, member, element, etc. in relation to one embodiment should not be construed as being limited to applications only within said embodiment. In addition, reference to a specific benefit, advantage, problem, solution, method of use, etc. in relation to one embodiment should not be construed as being limited to applications only within the embodiment.

The headings used herein are for organizational purposes only and are not meant to be used to limit the scope of the description or the claims. To facilitate understanding, like reference numerals have been used, where possible, to designate like elements common to the figures.

DETAILED DESCRIPTION OF THE INVENTION

Figure 1:
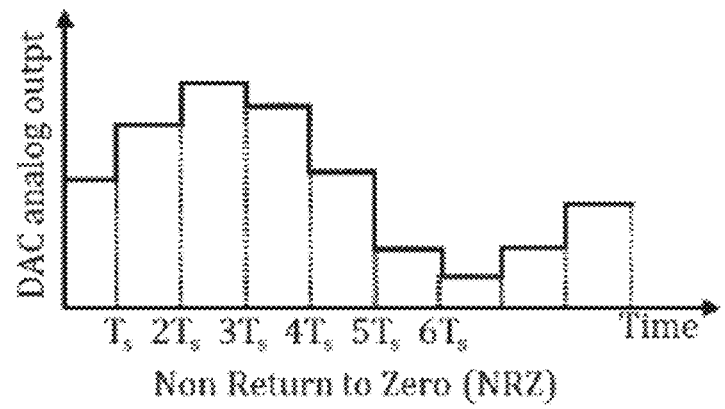
FIG. 1 are graphs of a typical DAC outputs (stepwise NRZ and RZ) and the resulting graph of the application of a low-pass filter as known in the art.
Figure 1:
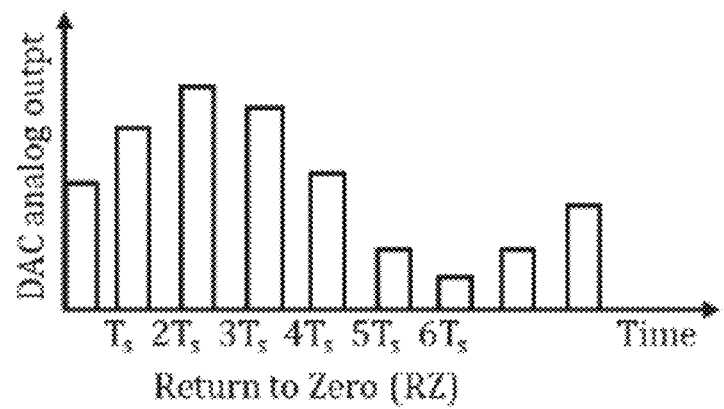
Figure 1:
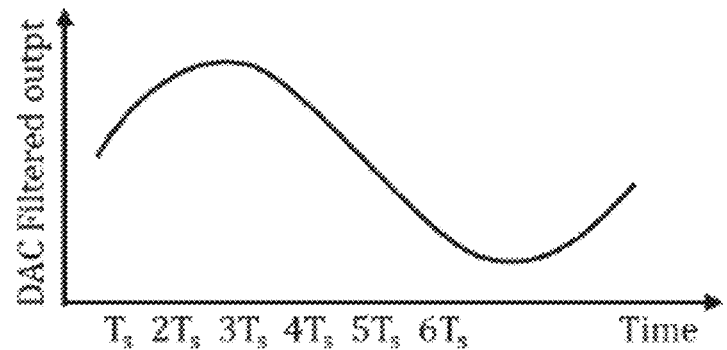
Figure 2:
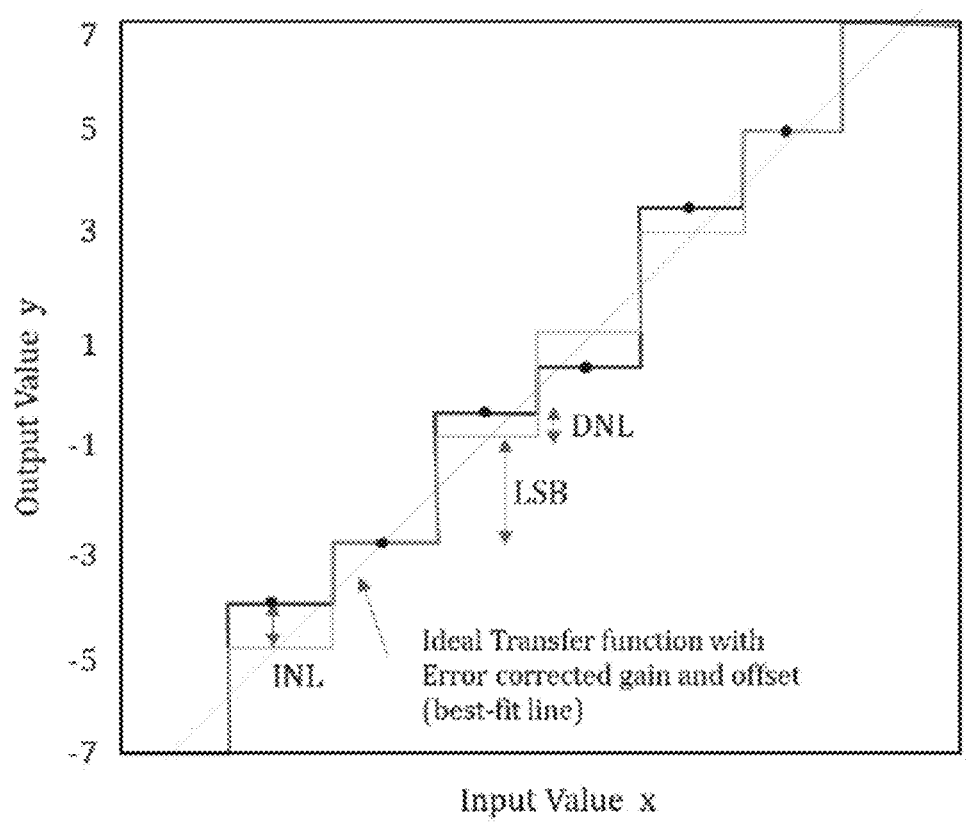
FIG. 2 is a graph of differential non-linearity and integral non-linearity as compared to an ideal transfer function as known in the art.

Turning now to the drawings, systems and methods for using redundancy mapping in DACs and ADCs in accordance with various embodiments of the invention are illustrated. In many embodiments, the system can select between multiple alternative mappings (at least two) with probabilities of each mapping determined based upon the number of bits of the DAC, and in a manner that can be independent of mismatch of the components. In many embodiments, the redundancy mapping probabilistic assignment can generate better linearity for the DACs as the linearization may not depend on component mismatches, and thus information about mismatches may not be needed as discussed in detail below. In particular, in many embodiments, mismatches can be converted to random noise that is distributed evenly over the Nyquist band. In certain embodiments, the linearization can be feed-forward and occur in the digital domain.

In many embodiments, the redundancy mapping techniques can be applied to ADCs, including Successive Approximation Register (SAR) ADCs. In many embodiments, the resolutions can range from 10 to 18 bits with speeds up to 20 MS/s. In many embodiments, a SAR architecture can result in low power consumption and small area and can be utilized for a wide variety of applications.

Different types of DACs and techniques to improve linearity have been used in the art, including conventional binary DACs, thermometer coded DACs, dynamic element matching (DEM) DACs, and segmented DACs, including two segment DACs, among others. A conventional DAC provides a binary architecture, where each binary input bit corresponds to a binary weighted element (voltage, current or charge). A B-bit Thermometer-coded DAC has 2B−1 unit elements, where the unit elements can be switched on or off in a certain sequence according to an input digital code, and can reduce INL/DNL. A DEM DAC may use a thermometer code that represents a natural number w with w ones followed by N-w zeros. A thermometer coded DAC may include N identical unit elements $U_{1:N}$ that can be turned on (activated) or off (deactivated) by N thermometer codes that represent the digital input word x. In a segmented DAC architecture, an input digital code is separated into multiple segments and each segment is converted into an analog signal with a sub-DAC. The segments are scaled and combined to create the overall transfer function.

As discussed in detail below, a problem of segmenting the bits to a sub-DACs can be a design compromise between complexity and performance. While a nearly-perfectly linear DAC can be realized by using only one segment and DEM, it may not be practical for high-resolution DACs. More bits in the DEM thermometer MSB sub-DAC can improve linearity but also increases the complexity. The benefits of using multiple thermometer segments with DEM can be greatly diminished as the inter-segment unit-element mismatch ($\beta_i \neq \beta_j$) and the inter-segment scaling errors ($N_k' \neq 2^{B_k}$) introduce nonlinearities. Thus, the most commonly used topology is a two segment DAC with a thermometer coded MSB segment and a binary coded LSB segment. Implementing high-speed DACs with nonlinearity better than 12-bits may be difficult.

There is an impact of mismatch in analog circuits. Thermal noise, quantization noise, mismatch and nonlinearity can be the main contributors to inaccuracies of analog circuits and impose minimum requirements on device area and power. Thermal noise is white and can benefit from averaging. Similarly, a well-designed quantizer has quantization noise that is white. Quantization noise also benefits from averaging and oversampling. Both thermal and quantization noise are expressed in dBc/Hz which is a measure of how the noise power is spectrally distributed over the Nyquist bandwidth. For narrow band systems, the integrated thermal and quantization noise over the receiver bandwidth is directly related to the receiver SNR. Typically, sources of nonlinearity are input buffers, amplifiers, and output drivers whose linearity can be modeled as a smooth polynomial function of lower order. The spurs caused by smooth polynomial approximations result in predictable harmonics at multiples of the fundamental frequency. Their effect in narrow band systems can be mitigated by proper frequency planning.

Mismatch is a phenomenon where identically designed devices (resistors, capacitors, MOS transistors) are not identical. Threshold voltage differences $\Delta VT$ and current factor differences $\Delta \beta$ are the dominant sources of mismatches in devices. Both $\Delta VT$ and $\Delta \beta$ are unknown during design but fixed (and still unknown) after fabrication. Anecdotal evidence and a wealth of measurement data show that mismatch generally improves with increased device area. Thus, quadrupling the area reduces mismatch by one bit. However, sizing current source transistors to match in excess of 14-bits may be impractical and can result in large parasitic capacitance.

Nonlinearity is mainly caused by mismatches that may be random, systematic, or a combination of both. The mismatches can be caused by differences between wafers, with a wafer, within a chip or between devices. The mismatches can be systematic (follow gradients) or are completely random. While systematic mismatches can usually be mitigated with layout methodologies and a choice of circuit architectures, the random mismatches due to the stochastic nature of physical geometry and doping cannot be avoided. Additionally, the current sources are strongly temperature dependent which can greatly exacerbate the problem. Random mismatches can result in performance that is predictably unpredictable.

In analog circuits, the receiver sensitivity is defined as the smallest signal that can be correctly processed in the presence of noise. Devices have to be sized to meet the RX sensitivity specifications. Increasing size negatively impacts speed and power because of larger capacitance. For a given bandwidth and accuracy, the limit on minimum power consumption imposed by device matching is about two orders of magnitude larger than the limit imposed by noise for deep submicron CMOS processes. Thus, it is device mismatch and not thermal noise that sets the limit on the smallest analog signal that can be processed.

Conventional DAC Architectures

Figure 3:
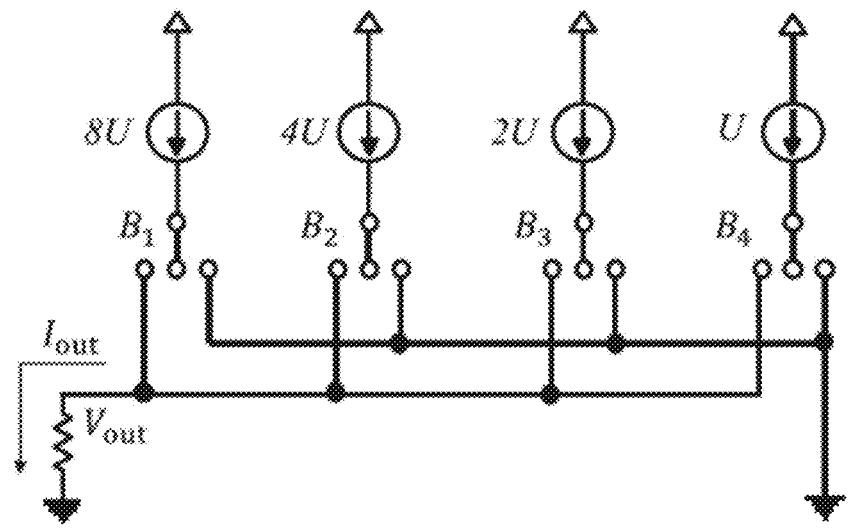
FIG. 3 is a diagram of a four-bit binary DAC as known in the art.

In a binary architecture, each binary input bit corresponds to a binary-weighted element (voltage, current or charge). An advantage of binary architecture is its simplicity and low implementation cost. However, the large ratio between the least significant element and the most significant element may cause a large mismatch between them. This can result in large DNL and INL errors. A typical 4-bit binary DAC architecture is shown in FIG. 3. A way to improve nonlinearity in a binary DAC architecture is to reduce mismatches of the unit elements.

Figure 4:
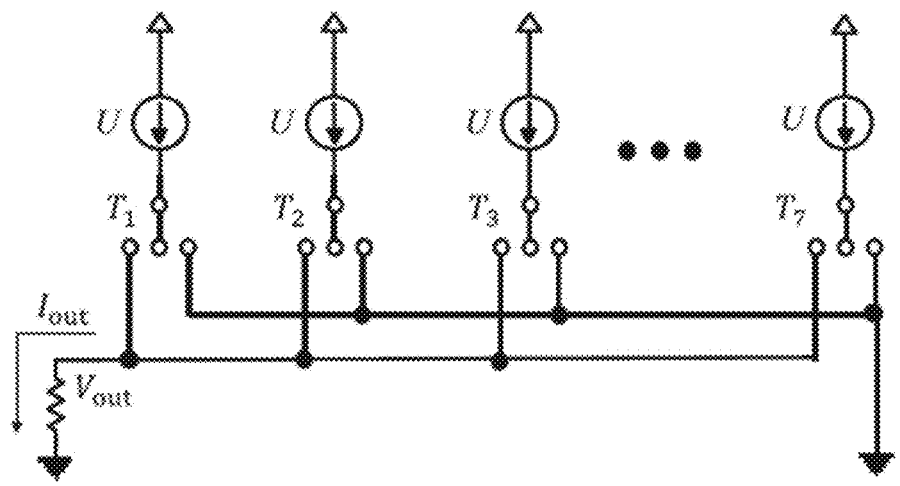
FIG. 4 is a three-bit thermometer DAC comprising seven-unit elements.

To overcome drawbacks of the binary DAC architecture, a thermometer-coded DAC architecture has been developed. A B-bit thermometer-coded DAC has 2B−1 unit elements. For example, a 3-bit thermometer DAC with seven-unit elements is shown in FIG. 4. These unit elements are switched on or off in a certain sequence according to the input digital code. Compared to the binary-coded architecture, the thermometer coded architecture reduces the INL/DNL at the expense of significant increase of implementation cost.

Figure 5A:
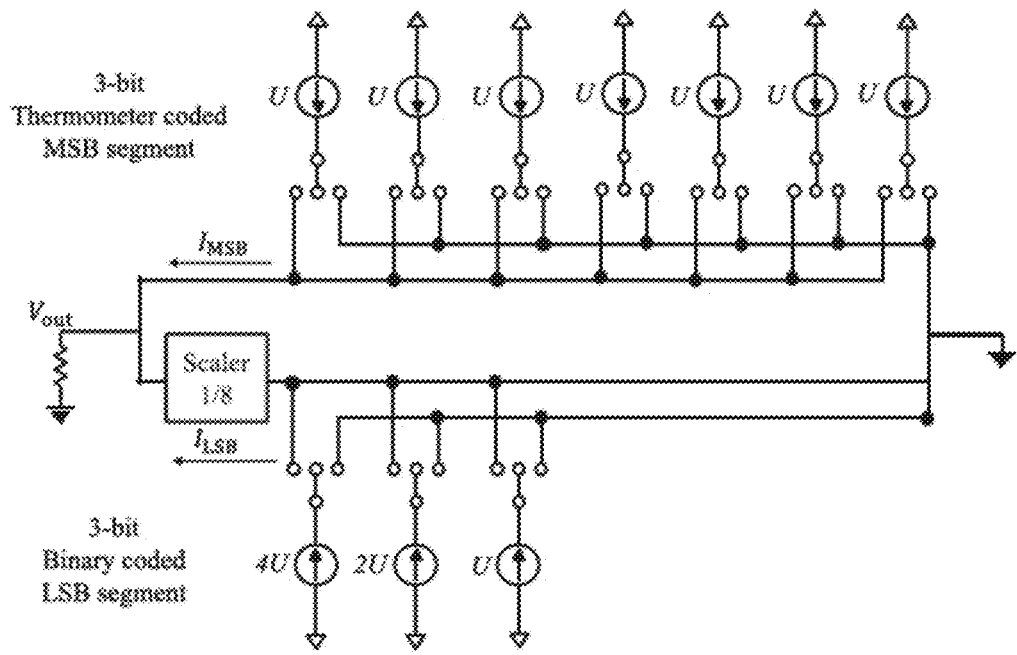
FIG. 5A is a two-segment six-bit DAC with a three-bit thermometer coded most significant bit and three-bit binary coded least significant bit.
Figure 5B:
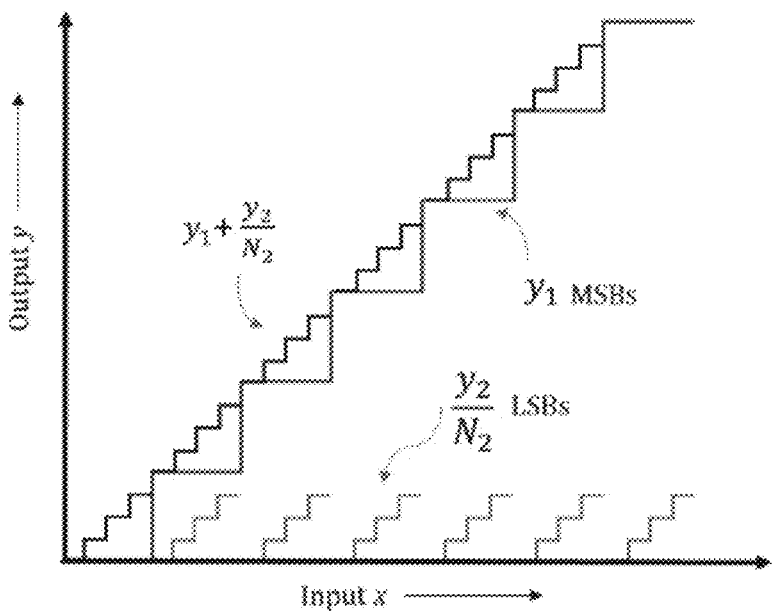
FIG. 5B is a graph of the transfer function of the DAC of FIG. 5A.

In a segmented architecture, an input digital code is separated into multiple segments and each segment is converted into an analog signal with a sub-DAC. The segments are scaled and combined to create the overall transfer function. The transfer function of a 2-segment DAC (e.g. 6-bit DAC in FIG. 5A) is shown in FIG. 5B. The segmented architecture balances the pros and cons of LSB binary segment and a thermometer MSB segment and is a widely used architecture in DAC design. The unit elements can be current sources, capacitors, resistors, or a combination.

Figure 6:
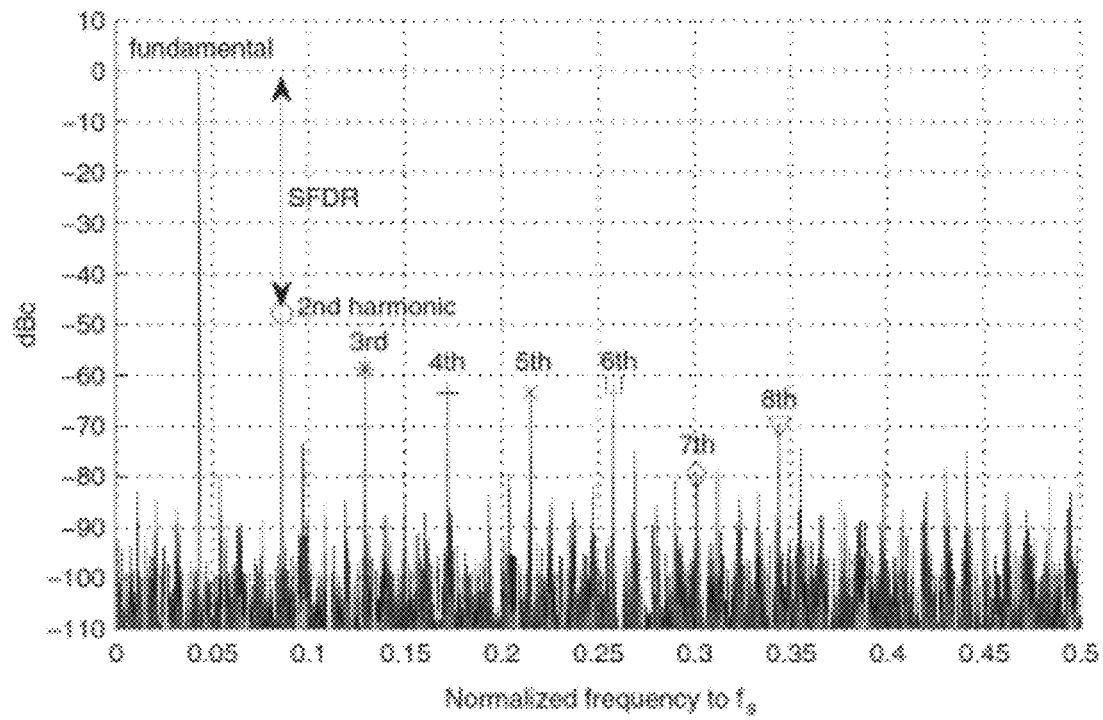
FIG. 6 is an output spectrum of a Nyquist DAC with a single-tone sine-wave input.

The output spectrum of a Nyquist DAC with a single-tone sine-wave input is shown in FIG. 6. As shown in the plot, there are harmonics at integer multiples of the fundamental frequency and a myriad of other frequency components which are due to the non-linearity (INL and DNL) of the DAC. The amplitude and location of the DNL spurs are unpredictable and depend on the input amplitude and frequency. Thus, non-linearity may be a key performance metric for DAC design.

Dynamic Element Matching

Much research has been devoted over the past several decades to improve the DAC non-linearity performance. It is well known that mismatches in the unit cells leads to unequal step sizes (DNL) in the DAC transfer function and causes spurs in the output spectrum. Dynamic Element Matching (DEM) is a well-known and widely used technique to linearize thermometer DACs and eliminate DNL in the presence of mismatches.

For DEM, a thermometer code $T_{1:N}$ represents a natural number w with w ones followed by N-w zeros. A thermometer coded DAC may comprise, or in some embodiments consists of, N identical unit elements $U_{1:N}$ that can be turned on (activated) or off (deactivated) by N thermometer codes that represent the digital input word x. In an unsigned representation x=w and in a signed representation x=2w−N. An example of the thermometer representation of a 3-bit natural number is shown in Table 1. The outputs of the N unit elements can be combined together in a DAC output network.

TABLE 1

| | 3-bit Thermometer Code Representation | | | | | | | |
|---|---|---|---|---|---|---|---|---|
| Bits | 000 | 001 | 010 | 011 | 100 | 101 | 110 | 111 |
| w | 0 | 1 | 2 | 3 | 4 | 5 | 6 | 7 |
| T | 0000000 | 1000000 | 1100000 | 1110000 | 1111000 | 1111100 | 1111110 | 1111111 |
| 2w − N | −7 | −5 | −3 | −1 | 1 | 3 | 5 | 7 |

For a thermometer code of weight w, w unit elements are turned on or off by the thermometer codes representing the input x=w. The smallest output occurs when all unit elements are turned off and the largest output value occurs when all unit elements are turned on. In general, the unit cells will not be identical and can be represented as $U_k=U+\Delta U_k=U(1+\epsilon_k)$ where U is the nominal value, $\Delta U_k$ is the deviation from the nominal value, and $E_k$ is the relative mismatch $\Delta U_k/U$.

Figure 7:
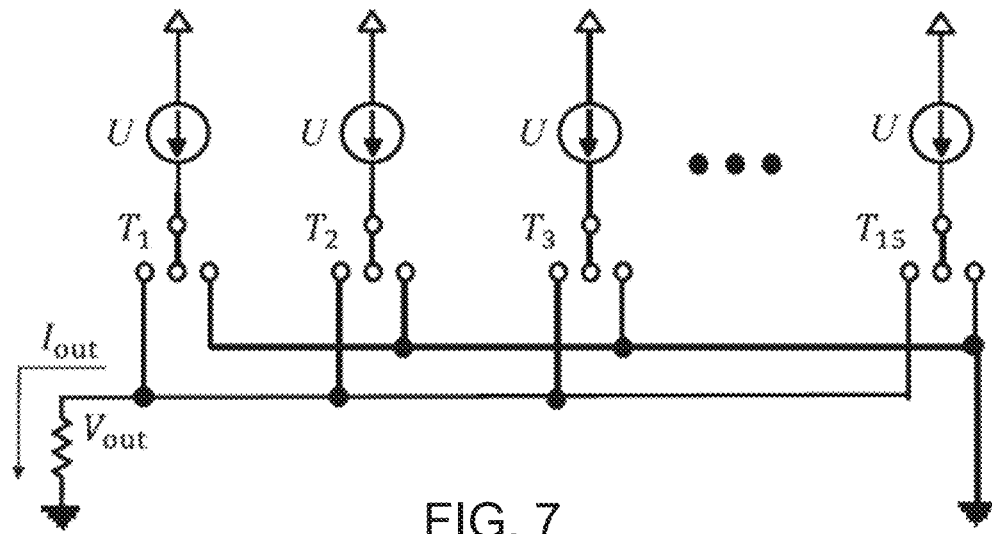
FIG. 7 is an architecture for a single ended four-bit thermometer coded DAC.

In a single ended DAC each thermometer code represents a '1' or a '0' and each unit element is either switched to the load resistor or to ground as shown in FIG. 7. In the ideal case, all unit cells are identical and $U_k=U$ for all k. In the absence of mismatch, the single ended output is given by:

$$y=\Sigma_{k=1}^{N}T_kU_k=\Sigma_{k-1}^{w}(1)U+\Sigma_{k=w+1}^{N}(0)U=wU$$

The input-output transfer function is a linear function.

Figure 8:
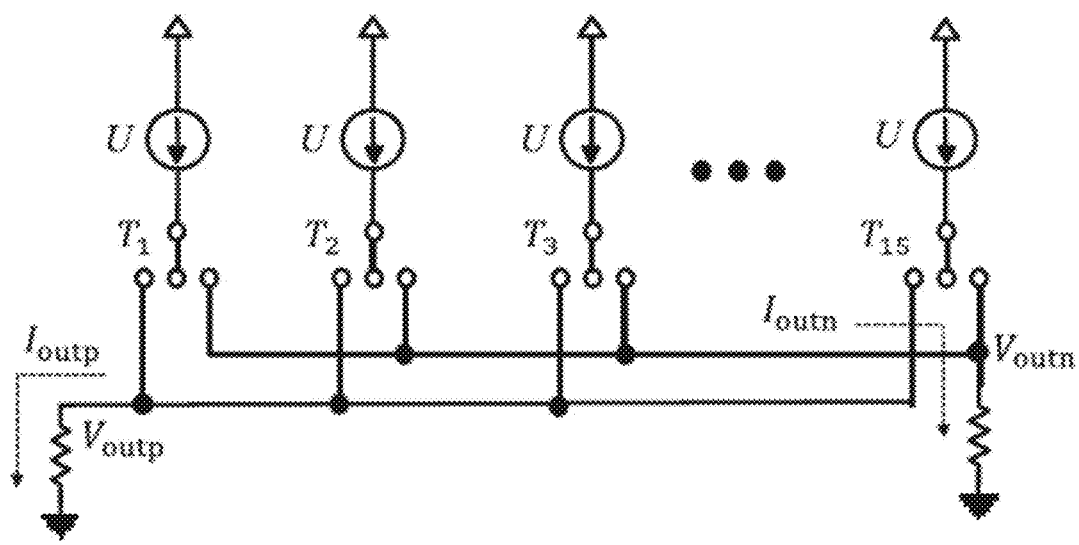
FIG. 8 is a differential DAC architecture for a complementary output DAC to the architecture of FIG. 7.

For a complementary output DAC shown in FIG. 8, each thermometer code represents a '1' when activated or a '−1' when deactivated, and the corresponding unit element is either switched to a positive or a negative load resistor. The complementary output is given by:

$$y=\Sigma_{k=1}^{N}T_kU_k=\Sigma_{k-1}^{w}(1)U+\Sigma_{k=w+1}^{N}(-1)U=(2w-N)U$$

In the ideal case, the complementary output is also a linear function of the input.

Figure 9:
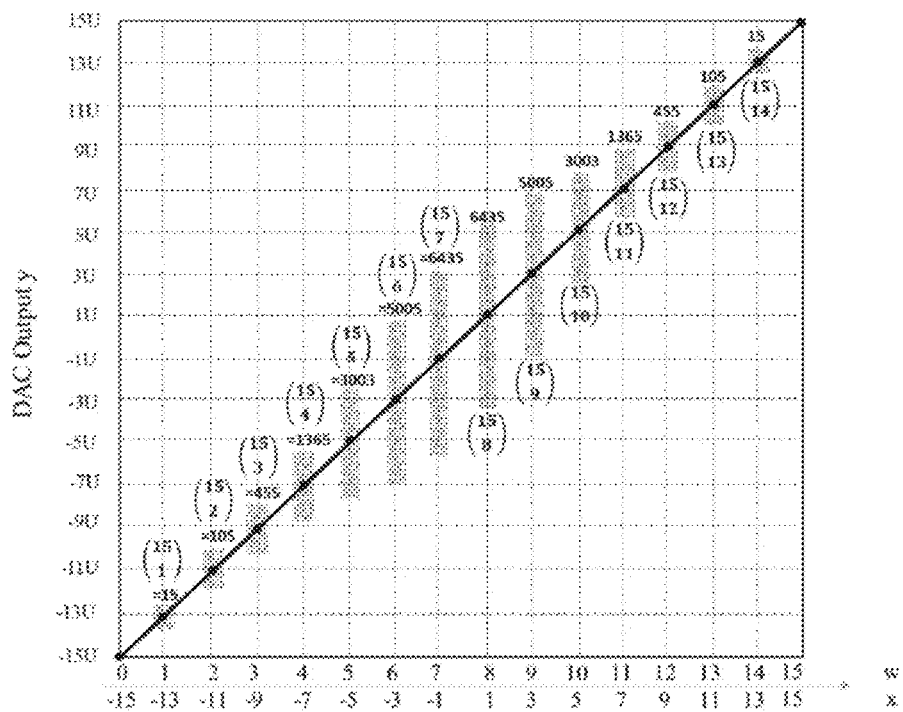
FIG. 9 is a plotting of the multiple analog output values of a DAC.

In DEM, different thermometer codes with the same weight w are used to represent successive occurrences of the same input in a random fashion. In other words, a different set of w elements $$\binom{N}{w}$$

are activated on successive appearances of the same digital input code. As shown in FIG. 9, the same digital $$\binom{N}{w}$$

input can potentially have multiple analog output values since there are $$\binom{N}{w}$$

ways to activate w elements out of N elements. Scrambling ensures that the permutations are uniformly chosen in a random fashion. The ensemble averaged output of the permutations approximate and resemble a perfectly linear DAC. DEM linearizes the average transfer function by decorrelating the error in the DAC output and the input. It is the average transfer function that determines the spurs in the output spectrum. While DEM results in a slight degradation in SNR, the improvement in SFDR can be very significant.

Figure 10:
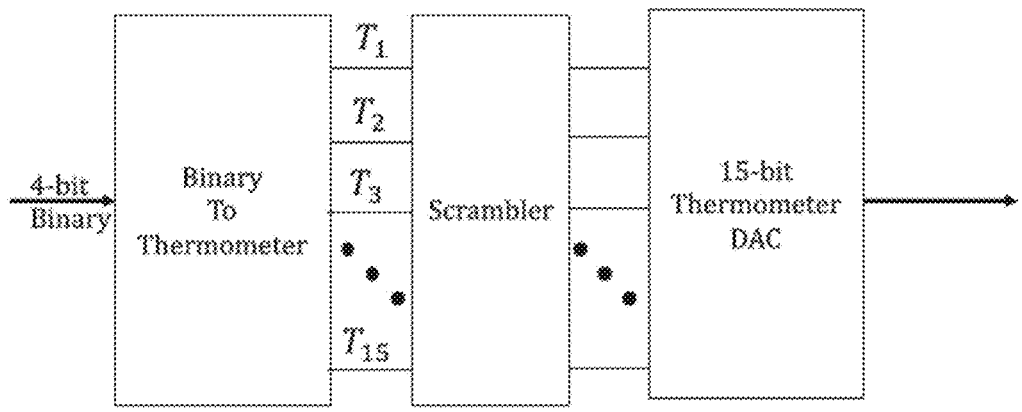
FIG. 10 is a schematic view of a four-bit thermometer DEM DAC.

A 4-bit DEM DAC is shown in FIG. 10. The 4-bit digital code is converted to a 15-bit thermometer code $T_{1:15}$. The number of elements activated by the thermometer bits is proportional to the input digital code. The thermometer code is scrambled (a permutation operation) that randomizes the location of the active elements but keeps the number of active elements unchanged. The scrambled thermometer code activates and deactivates the corresponding unit elements. The unit elements are combined in the DAC Output Network to create the output.

The average transfer function of a DEM DAC will be described. Simple combinatorial analysis shows that there is a total of $$\binom{N}{w}$$

ways to activate w elements out of N elements. The expected value of the output when w unit elements are activated can be found by first calculating the probability $P_w(T_k=1)$ of activating a bit at the $k^{th}$ location and the probability $P_w(T_k=0)$ of deactivating a bit at the $k^{th}$ location. There are $$\binom{N-1}{w}$$

ways to activate an element at the $k^{th}$ location for a thermometer code of weight w. Since w elements always must be activated, this is equivalent to activating an additional w−1 elements at the remaining N−1 potential locations once the $k^{th}$ location is activated. Similarly, there are $$\binom{N-1}{w-1}$$

ways to deactivate an element at the $k^{th}$ location of a thermometer code. This is equivalent to activating w elements at N−1 potential locations after the $k^{th}$ location is deactivated. Thus, one can calculate the probabilities of activating or deactivating the $k^{th}$ bit as:

$$P_w(T_k=1)=\binom{N-1}{w-1}/\binom{N}{w}=\frac{w}{N} \text{ and } P_w(T_k=0)=\binom{N-1}{w}/\binom{N}{w}=\frac{N-w}{N}$$

The output of the DAC is given by:

$$y = \sum_{k=1}^{N} T_k \cdot U_k$$

By performing the expectation over the $$\binom{N}{w}$$

values, the average complementary output is:

$$\bar{y} = E[y] = E\left[\sum_{k=1}^{N} T_k \cdot U_k\right] =$$

$$\sum_{k=1}^{N} E[T_k] \cdot U_k = \sum_{k=1}^{N} P_w(T_k = 1) \cdot (1) \cdot U_k + P_k(T_k = 0) \cdot (-1) \cdot U_k$$

Substituting for the probabilities $P_w(T_k=1)$ and $P_w(T_k=0)$ from equations (1) & (2) (found below) and noting that $U_k=U(1+\epsilon_k)$ to account for unit cell mismatches, it is obtained:

$$E[y] = (2w - N) \cdot U \cdot \left(1 + \frac{1}{N}\sum_{k=1}^{N} \epsilon_k\right) = (2w - N) \cdot U \cdot (1 + \alpha)$$

where $$\alpha = \left(\frac{1}{N}\sum_{k=1}^{N} \epsilon_k\right) \quad (2)$$

or $$\bar{y} = x \cdot U \cdot (1 + \alpha) \quad (3)$$

Figure 11:
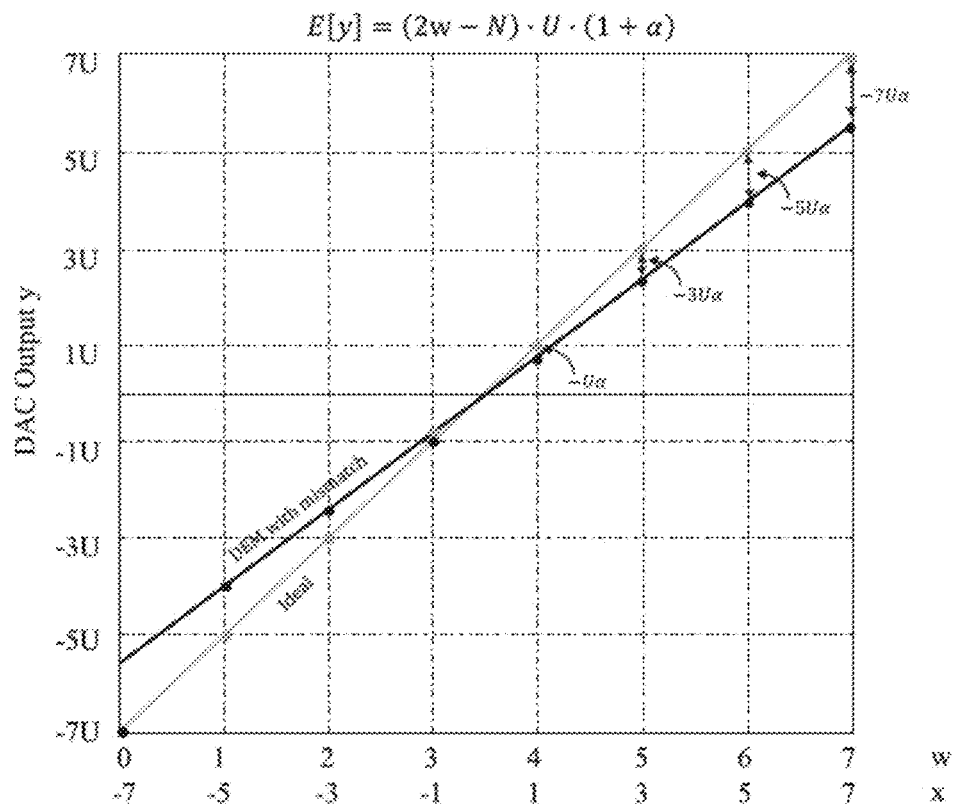
FIG. 11 is a graph of an ideal transfer function and a linearized DEM DAC.

Here, $\alpha$ is the average mismatch of the unit elements and is a constant for a given unit element mismatch profile. The average output of the DEM DAC is linearly proportional to its input $x=2w-N$. The scaling factor of $(1+\alpha)$ is a gain error when compared to the output of an ideal DAC. The ideal and DEM transfer functions of a 3-bit DAC are shown in FIG. 11. Since it is a linear system, the error is also proportional to the input. The unit element U is assumed to be 1 henceforth without any loss in generality.

Segmented DACs

Figure 13:
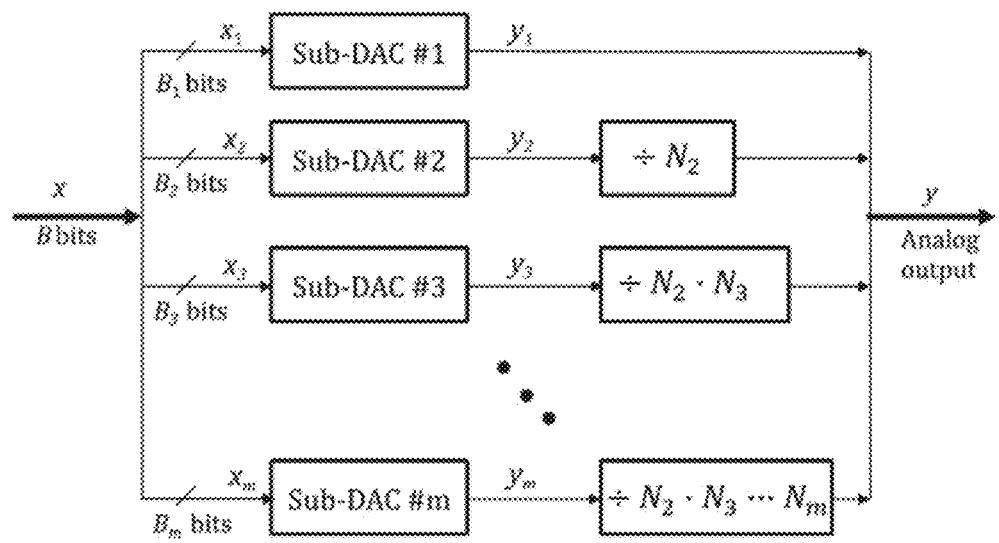
FIG. 13 is a schematic view of an implementation of a multi-segment DAC.

A fully thermometer coded DAC with DEM is typically linear. A B-bit thermometer DAC requires $2^B-1$ unit elements. The cost and power of a fully thermometer coded DAC grows exponentially with the number of bits. So, a full thermometer implementation is seldom used beyond 8 bits. In a segmented DAC, the B-bit input digital word x is decomposed into m-segments $x_1, x_2, \ldots, x_m$ with bits $B_1, B_2, \ldots, B_m$ such that $B=B_1+B_2+\ldots+B_m$. The first sub-DAC handles the first $B_1$ bits, the second sub-DAC handles the next $B_2$ bits, and the $m^{th}$ sub-DAC handles the last $B_m$ bits. The segmented DAC requires only $(2^{B_1}-1)+(2^{B_2}-1)+\ldots+(2^{B_m}-1)$ unit elements. Thus, segmentation can result in a significant reduction in complexity. The higher resolution DAC is implemented by combining the outputs of several smaller sub-DACs as shown in FIG. 13.

The B-bit digital input x is associated with the inputs of the m-segments as a binary weighted summation:

$$x = x_1 + \frac{x_2}{N_2} + \frac{x_3}{N_2 \cdot N_3} + \cdots + \frac{x_m}{N_2 \cdot N_3 \ldots N_m} \quad (4)$$

where $N_2=2^{B_2}$, $N_3=2^{B_3}$, $\ldots$, $N_m=2^{B_m}$ and the output of the DAC is a weighted combination of the outputs of the m sub-DACs:

$$\bar{y} = \bar{y}_1 + \frac{\bar{y}_2}{N_2} + \frac{\bar{y}_3}{N_2 \cdot N_3} + \cdots + \frac{\bar{y}_m}{N_2 \cdot N_3 \ldots N_m} \quad (5)$$

When there are no mismatches, the output of each sub-DAC equals its input, and $y_k=x_k \forall k \in [1, \ldots, m]$. The output of the ideal DAC is equal to its B-bit digital input x $$y_{ideal} = x_1 + \frac{x_2}{N_2} + \frac{x_3}{N_2 \cdot N_3} + \cdots + \frac{x_m}{N_2 \cdot N_3 \ldots N_m} = x$$

In the case of non-ideal implementations each, sub-DAC can employ DEM for linearization. The average output of $i^{th}$ sub-DAC is given by $y_i=x_i \cdot (1+\alpha_i)$ where $\alpha_i$ is the average mismatch of the unit elements in the $i^{th}$ sub-DAC. The output of the DAC is given by:

$$\bar{y} = x_1 \cdot (1 + \alpha_1) + \frac{x_2 \cdot (1 + \alpha_2)}{N_2} + \frac{x_3 \cdot (1 + \alpha_3)}{N_2 \cdot N_3} + \cdots + \frac{x_m \cdot (1 + \alpha_m)}{N_2 \cdot N_3 \ldots N_m}$$

$$\bar{y} = x + x_1 \cdot \alpha_1 + \frac{x_2 \cdot \alpha_2}{N_2} + \frac{x_3 \cdot \alpha_3}{\underbrace{N_2 \cdot N_3}_{\varepsilon_x}} + \cdots + \frac{x_m \cdot \alpha_m}{N_2 \cdot N_3 \ldots N_m}$$

Since the $\alpha_i$ are different for each segment the error term $\varepsilon$ is not linearly related to the input x, that is $\varepsilon_x \neq kx$ for any k, hence, the output is not a linear function of x.

In the presence of mismatch, combining the output of the sub-DACs after segmentation re-introduces nonlinearity into the transfer function. Even though the individual thermometer segments are linearized by DEM, combining the outputs of the linear sub-DACs will not be linear. Therefore, for higher resolution DACs, a segmented architecture is a compromise approach that balances accuracy, speed, cost and power at the expense of nonlinearity.

The output of the DAC can also be written as:

$$y = y_1 + \frac{1}{N_2}\left(y_2 + \frac{1}{N_3}\left(y_3 + \cdots + \frac{1}{N_{m-2}}\left(y_{m-2} + \underbrace{\frac{1}{N_{m-1}}\left(y_{m-1} + \underbrace{\frac{y_m}{N_m}}_{Two\ Segment}\right)}_{Two\ Segment}\right)\right)\right) \quad (6)$$

Each segment is scaled and combined with the segment preceding it. Thus, it is useful to analyze the performance of a two-segment DAC in the presence of mismatches. The results can be extended to multiple segments by the nested nature of the computations in Eq. (6).

Non-Linearity of Two Segment DAC

Figure 12:
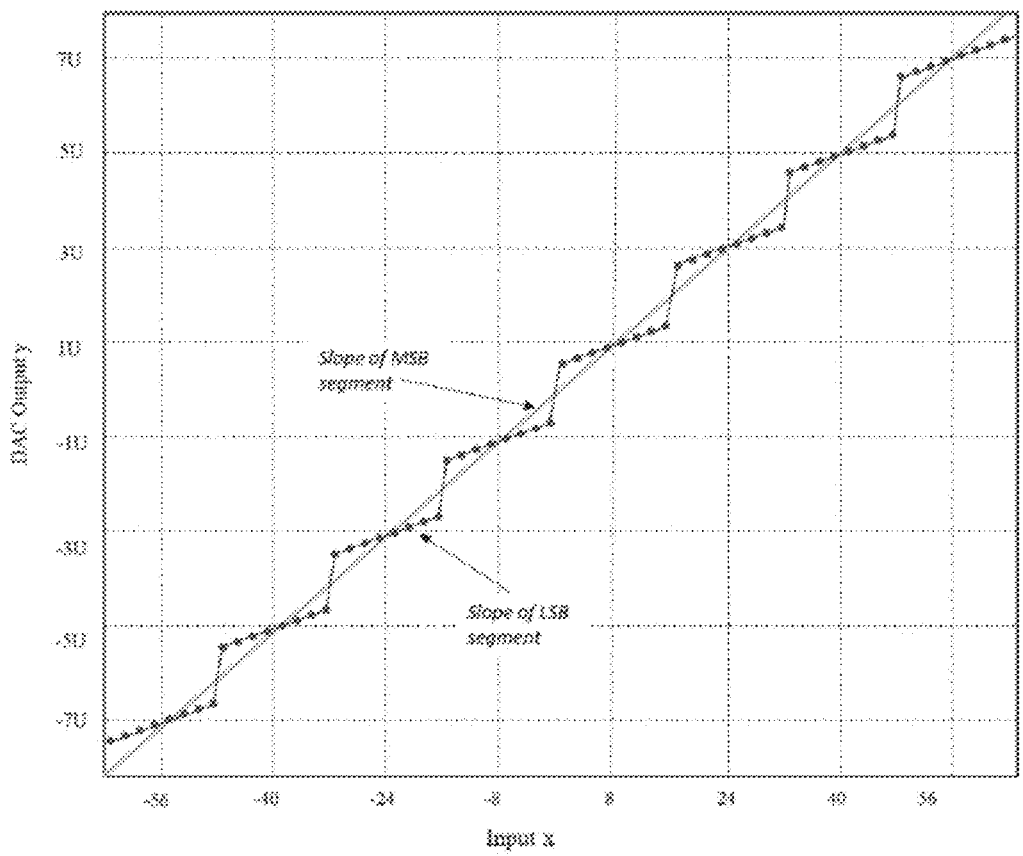
FIG. 12 is a graph demonstrating a higher resolution DAC implemented by combining the outputs of several smaller sub-DACs.

In a two segment DAC, the most significant $B_1$ bits are associated with the first segment and the remaining least significant $B_2$ bits are associated with the second segment. In the presence of mismatches, the outputs of the linearized sub-DACs are given by $y_1=x_1(1+\beta_1)$ and $y_2=x_2(1+\beta_2)$ where the $\beta$s represent the average unit-element mismatch in each segment. $N_2'=N_2(1+\gamma_2)$ is the scaling factor with mismatch where $\gamma_2$ represents the deviation from the ideal power-of-two values. The output of the DAC can be written as:

$$y = y_1 + \frac{y_2}{N_2'} = x_1(1+\beta_1) + \frac{x_2(1+\beta_2)}{N_2(1+\gamma_2)} = (1+\beta_1)\left(x_1 + \frac{x_2(1+\alpha_2)}{N_2}\right)$$

where $\alpha_2$ is a parameter that consolidates the impact of all the mismatches. $(1+\beta_1)$ is a gain factor that changes the full scale of the DAC but does not impact the linearity of the DAC. The transfer function of an m-segment DAC is shown in FIG. 12.

The problem of segmenting the bits to the sub-DACs is a design compromise between complexity and performance. While a nearly-perfectly linear DAC can be realized by using only one segment and DEM, it may not be practical for high-resolution DACs. More bits in the DEM thermometer MSB sub-DAC improves linearity but also increases the complexity. The benefits of using multiple thermometer segments with DEM are greatly diminished as the inter-segment unit-element mismatch $(\beta_i \neq \beta_j)$ and the inter-segment scaling errors $(N_k' \neq 2^{B_k})$ introduce nonlinearities. Thus, the most commonly used topology is a two segment DAC with a thermometer coded MSB segment and a binary coded LSB segment. Implementing high-speed DACs with non-linearity better than 12-bits may be difficult.

DAC with Redundancy Mapping

With reference to FIGS. 14-20, the system, device and method according to features of the present embodiments will be described. Many embodiments can significantly reduce a non-linearity of a DAC and remove the conventional trade-offs between performance and complexity.

In a two-segment DAC, the input x can be decomposed into two segments $(x_1, x_2)$ and $$x = f(x_1, x_2) = x_1 + \frac{x_2}{N_2}$$

$(x_1', x_2')$ is a redundant representation of the input x if $$f(x_1', x_2') = x_1' + \frac{x_2'}{N_2} = x$$

Consider the mapping $(x_1, x_2) \rightarrow (x_1', x_2')$ defined as $$x_1' = x_1 + \delta x_1 \cdot \text{sgn}(x_2) x_2' = (|x_2| - N_2 \cdot \delta x_1) \cdot \text{sgn}(x_2) \quad (6)$$

Substituting for $x_1'$ and $x_2'$, the following is obtained $$f(x_1', x_2') = \overbrace{x_1 + \delta x_1 \cdot \text{sgn}(x_2)}^{x_1'} + \overbrace{\frac{(|x_2| - N_2 \cdot \delta x_1) \cdot \text{sgn}(x_2)}{N_2}}^{x_2'} = x_1 + \frac{x_2}{N_2} = x$$

$x_1$ takes on values between $-N_1+1$ and $N_1-1$ in steps of 2. By choosing $\delta x_1=2$ the mapping $(x_1, x_2) \rightarrow x_1'$ is an increment or decrement operation. The mapping to $x_2'$ is shown in the Table 2 for a 3-bit sub-DAC with $N_2=8$ and $N_2 \cdot \delta x_1=16$. Since $|x_2|<N_2 \cdot \delta x_1$, $x_2$ and $x_2'$ always have opposite signs.

TABLE 2

| Redundancy Mapping | | | | | | | | |
|---|---|---|---|---|---|---|---|---|
| $x_2$ | −7 | −5 | −3 | −1 | 1 | 3 | 5 | 7 |
| $x_2'$ | 9 | 11 | 13 | 15 | −15 | −13 | −11 | −9 |
| $x_1'$ | $x_1-2$ | $x_1-2$ | $x_1-2$ | $x_1-2$ | $x_1+2$ | $x_1+2$ | $x_1+2$ | $x_1+2$ |

In a DAC output for redundant inputs, the output of the DAC for input $x \rightarrow (x_1, x_2)$ is given by:

$$y = (1+\beta_1) \cdot \left(x_1 + \frac{x_2(1+\alpha_2)}{N_2}\right) = (1+\beta_1) \cdot \left(x + \frac{\overbrace{\alpha_2}^{e}}{N_2} \cdot x_2\right)$$

For a redundant representation $x \rightarrow (x_1', x_2')$, the output of the DAC is given by:

$$y' = (1+\beta_1) \cdot \left(x_1' + \frac{x_2'(1+\alpha_2)}{N_2}\right) = (1+\beta_1) \cdot \left(x + \frac{\overbrace{\alpha_2}^{e'}}{N_2} \cdot x_2'\right)$$

Figure 14:
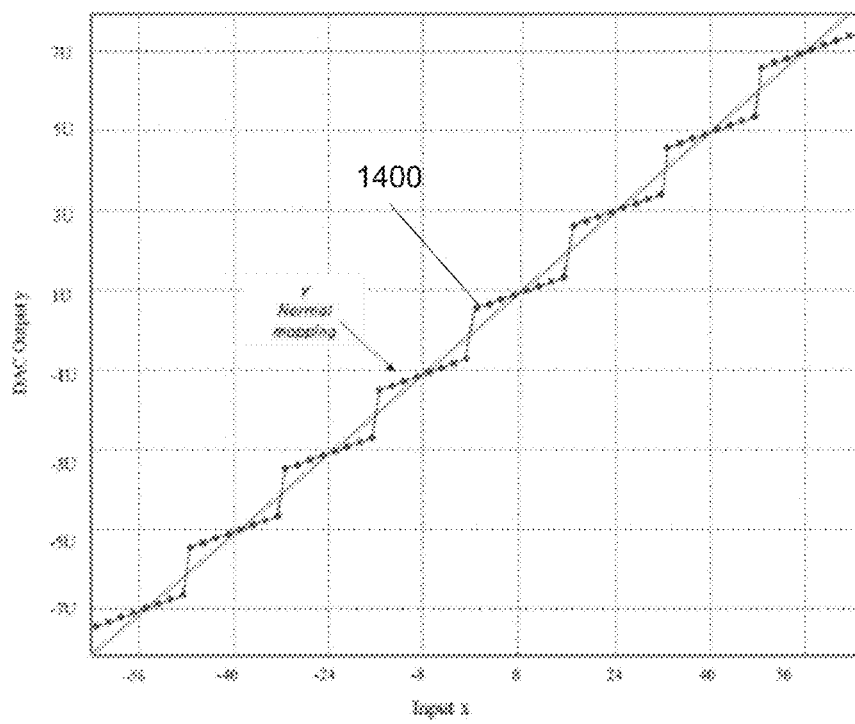
FIG. 14 is a graph a DAC transfer function with normal mapping according to an embodiment of the invention.
Figure 15:
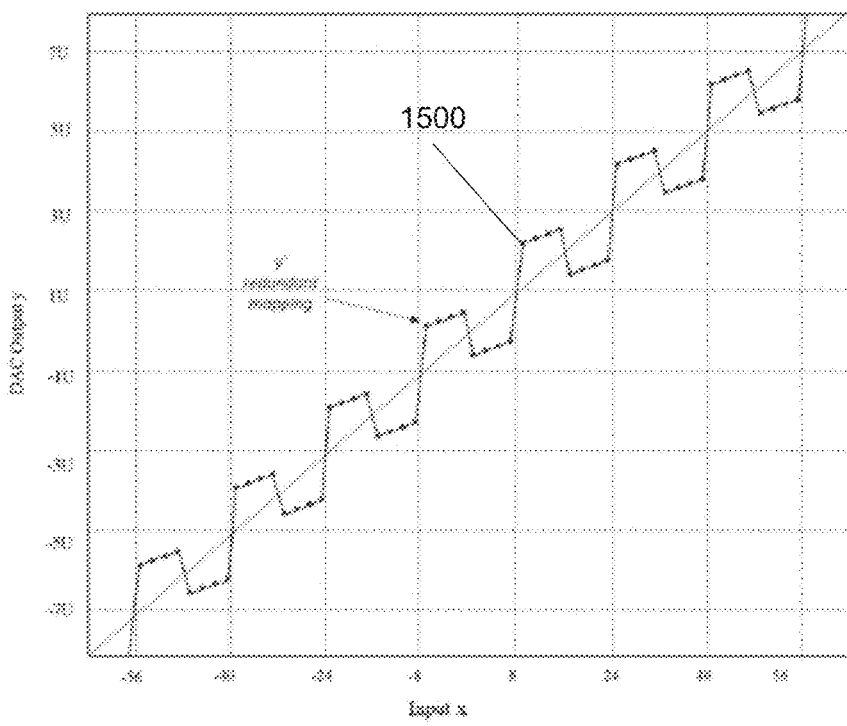
FIG. 15 is a graph of a DAC transfer function with redundant mapping according to an embodiment of the invention.

The transfer functions for y 1400 and y' 1500 are shown in FIGS. 14 and 15, respectively. Clearly, in a DAC with mismatches, $y' \neq y \neq x$ although $x'=x$.

Let p be the probability of choosing the representation $(x_1, x_2)$, and $p'=1-p$ be the probability of choosing the redundant representation $(x_1', x_2')$. For any input x, the output of the DAC can assume a value of y with a probability of p or a value of y' with a probability of p'. The average value of the DAC output is given by the expected value of y $$y_{avg} = E[y] = p \cdot y + p' \cdot y' = (1+\beta_1) \cdot \left[x + \frac{\alpha_2}{N_2} \cdot (p \cdot x_2 + p' \cdot x_2')\right]$$

As noted earlier, $x_2$ and $x_2'$ always have opposite polarities, so $\text{sgn}(x_2') = -\text{sgn}(x_2)$. Therefore, it is possible to find a set of non-negative weights w and w' such that the weighted sum $w \cdot x_2 + w' \cdot x_2' = 0$. It is easy to see that, by choosing $w=|x_2'|$ and $w'=|x_2|$ and using the identity $x=|x| \cdot \text{sgn}(x)$, the weighted sum becomes $|x_2| \cdot |x_2'| \cdot [\text{sgn}(x_2) + \text{sgn}(x_2')]$ which is always zero. Furthermore, normalizing the weights as $$w = \frac{|x_2'|}{|x_2|+|x_2'|} \text{ and } w' = \frac{|x_2|}{|x_2|+|x_2'|}$$

also results in a zero weighted sum, and $w=1-w'$.

By choosing the probabilities p and p' as:

$$p' = \frac{|x_2|}{|x_2|+|x_2'|} \rightarrow \text{probability of choosing } (x_1', x_2') \quad (7)$$

$$p = 1-p' = \frac{|x_2'|}{|x_2|+|x_2'|} \rightarrow \text{probability of choosing } (x_1, x_2)$$

with the sum $p \cdot x_2 + p' \cdot x_2'$ is always zero and $$y_{avg} = E[y] = (1+\beta_1) \cdot x$$

Figure 16:
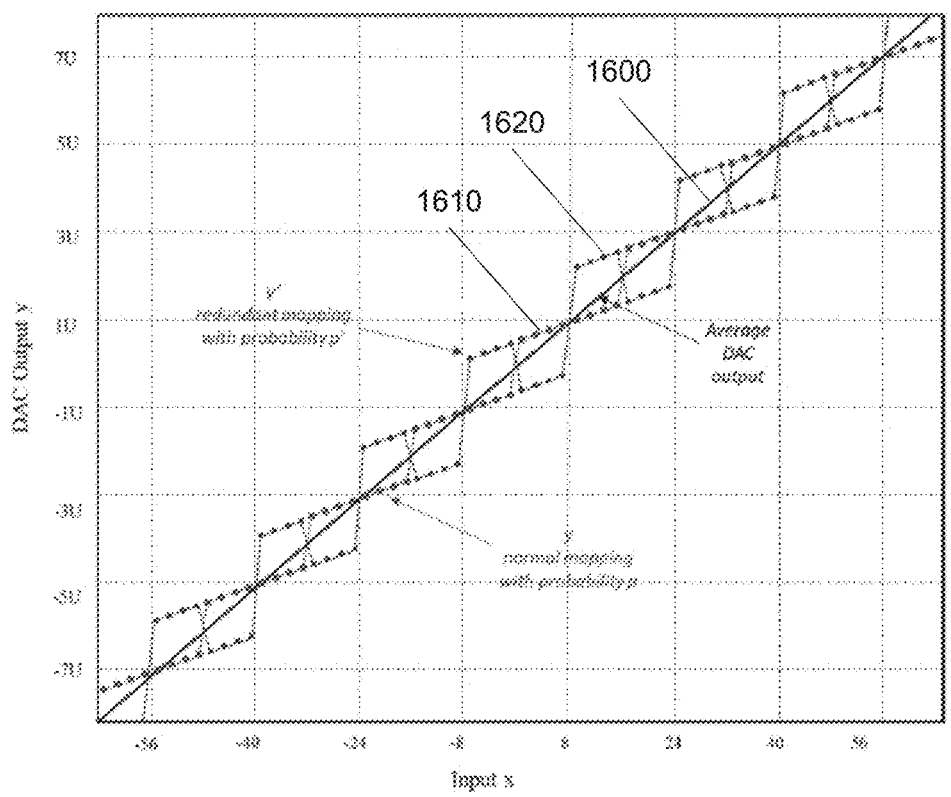
FIG. 16 is a graph of the probabilistic assignment between DAC transfer functions with respective normal and redundant mapping according to an embodiment of the invention.
Figure 17:
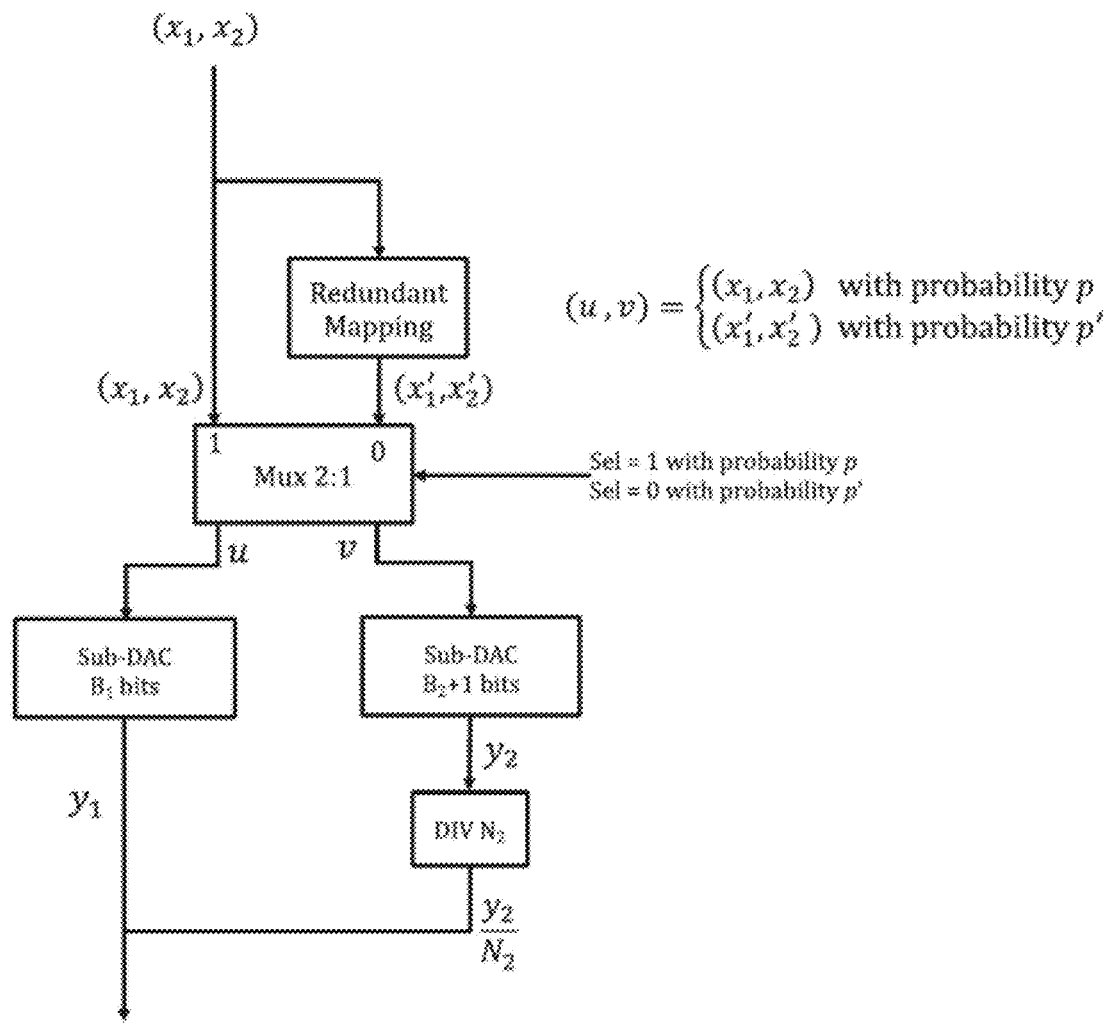
FIG. 17 is a schematic view of an implementation of a two-segment DAC with redundancy and probabilistic mapping according to an embodiment of the invention.

Thus, by selecting $(x_1, x_2)$ with a probability of p 1610 and selecting $(x_1', x_2')$ with a probability of p' 1620, the average output 1600 of the DAC may be perfectly linear as shown in FIG. 16. The DAC errors e and e' are proportional to $x_2$ and $x_2'$. It follows that a zero weighted sum also results in a zero average DAC error. The linearization is achieved through a combination of redundant mapping and probabilistic assignment. The architecture for a 2-segment DAC accomplishing such linearization is shown in FIG. 17 and will be discussed hereinbelow.

The probability p depends only on the value of $x_2$ and does not depend on the mismatches of the sub-DACs. Substituting for x we obtain:

$$p' = \frac{|x_2|}{N_2 \cdot \delta x_1}$$

$$p = 1 - p' = \frac{N_2 \cdot \delta x_1 - |x_2|}{N_2 \cdot \delta x_1}$$

The probabilities p and p' for a 1-bit DAC are shown in Table 1.

TABLE 1

Probability Assignment for a 1-bit sub-DAC

| $x_2$ | −1 | 1 |
|---|---|---|
| $x'_2$ | 3 | −3 |
| p | 3/4 | 3/4 |
| p' | 1/4 | 1/4 |

The probabilities p and p' for a 2-bit DAC are shown in Table 2.

TABLE 2

Probability Assignment for a 2-bit sub-DAC

| $x_2$ | −3 | −1 | 1 | 3 |
|---|---|---|---|---|
| $x'_2$ | 5 | 7 | −7 | −5 |
| p | 5/8 | 7/8 | 7/8 | 5/8 |
| p' | 3/8 | 1/8 | 1/8 | 3/8 |

The probabilities p and p' for a 3-bit DAC are shown in Table 3.

TABLE 3

Probability Assignment for a 3-bit sub-DAC

| $x_2$ | −7 | −5 | −3 | −1 | 1 | 3 | 5 | 7 |
|---|---|---|---|---|---|---|---|---|
| $x'_2$ | 9 | 11 | 13 | 15 | −15 | −13 | −11 | −9 |
| p | 9/16 | 11/16 | 13/16 | 15/16 | 15/16 | 13/16 | 11/16 | 9/16 |
| p' | 7/16 | 5/16 | 3/16 | 1/16 | 1/16 | 3/16 | 5/16 | 7/16 |

The probabilities p and p' for a 4-bit DAC are shown in Table 4.

TABLE 4

Probability Assignment for a 4-bit sub-DAC

| $x_2$ | −15 | −13 | −11 | −9 | −7 | −5 | −3 | −1 |
|---|---|---|---|---|---|---|---|---|
| $x'_2$ | 17 | 19 | 21 | 23 | 25 | 27 | 29 | 31 |
| p | 17/32 | 19/32 | 21/32 | 23/32 | 25/32 | 27/32 | 29/32 | 31/32 |
| p' | 15/32 | 13/32 | 11/32 | 9/32 | 7/32 | 5/32 | 3/32 | 1/32 |
| $x_2$ | 1 | 3 | 5 | 7 | 9 | 11 | 13 | 15 |
| $x'_2$ | −31 | −29 | −27 | −25 | −23 | −21 | −19 | −17 |
| p | 31/32 | 29/32 | 27/32 | 25/32 | 23/32 | 21/32 | 19/32 | 17/32 |
| p' | 1/32 | 3/32 | 5/32 | 7/32 | 9/32 | 11/32 | 13/32 | 15/32 |

The probabilities p and p' for a 5-bit DAC are shown in Table 5.

TABLE 5

Probability Assignment for a 5-bit sub-DAC

| $x_2$ | −31 | −29 | −27 | −25 | −23 | −21 | −19 | −17 |
|---|---|---|---|---|---|---|---|---|
| $x'_2$ | 33 | 35 | 37 | 39 | 41 | 43 | 45 | 47 |
| p | 33/64 | 35/64 | 37/64 | 39/64 | 41/64 | 43/64 | 45/64 | 47/64 |
| p' | 31/64 | 29/64 | 27/64 | 25/64 | 23/64 | 21/64 | 19/64 | 17/64 |
| $x_2$ | −15 | −13 | −11 | −9 | −7 | −5 | −3 | −1 |
| $x'_2$ | 49 | 51 | 53 | 55 | 57 | 59 | 61 | 63 |
| p | 49/64 | 51/64 | 53/64 | 55/64 | 57/64 | 59/64 | 61/64 | 63/64 |
| p' | 15/64 | 13/64 | 11/64 | 9/64 | 7/64 | 5/64 | 3/64 | 1/64 |
| $x_2$ | 1 | 3 | 5 | 7 | 9 | 11 | 13 | 15 |
| $x'_2$ | −63 | −61 | −59 | −57 | −55 | −53 | −51 | −49 |
| p | 63/64 | 61/64 | 59/64 | 57/64 | 55/64 | 53/64 | 51/64 | 49/64 |
| p' | 1/64 | 3/64 | 5/64 | 7/64 | 9/64 | 11/64 | 13/64 | 15/64 |
| $x_2$ | 17 | 19 | 21 | 23 | 25 | 27 | 29 | 31 |
| $x'_2$ | −47 | −45 | −43 | −41 | −39 | −37 | −35 | −33 |
| p | 47/64 | 45/64 | 43/64 | 41/64 | 39/64 | 37/64 | 35/64 | 33/64 |
| p' | 17/64 | 19/64 | 21/64 | 23/64 | 25/64 | 27/64 | 29/64 | 31/64 |

The probabilities p and p' for a 6-bit DAC are shown in Table 6.

TABLE 6

Probability Assignment for a 6-bit sub-DAC

| $x_2$ | −63 | −61 | −59 | −57 | −55 | −53 | −51 | −49 |
|---|---|---|---|---|---|---|---|---|
| $x'_2$ | 65 | 67 | 69 | 71 | 73 | 75 | 77 | 79 |
| p | 65/128 | 67/128 | 69/128 | 71/128 | 73/128 | 75/128 | 77/128 | 79/128 |
| p' | 63/128 | 61/128 | 59/128 | 57/128 | 55/128 | 53/128 | 51/128 | 49/128 |
| $x_2$ | −47 | −45 | −43 | −41 | −39 | −37 | −35 | −33 |
| $x'_2$ | 81 | 83 | 85 | 87 | 89 | 91 | 93 | 95 |
| p | 81/128 | 83/128 | 85/128 | 87/128 | 89/128 | 91/128 | 93/128 | 95/128 |
| p' | 47/128 | 45/128 | 43/128 | 41/128 | 39/128 | 37/128 | 35/128 | 33/128 |
| $x_2$ | −31 | −29 | −27 | −25 | −23 | −21 | −19 | −17 |
| $x'_2$ | 97 | 99 | 101 | 103 | 105 | 107 | 109 | 111 |
| p | 97/128 | 99/128 | 101/128 | 103/128 | 105/128 | 107/128 | 109/128 | 111/128 |
| p' | 31/128 | 29/128 | 27/128 | 25/128 | 23/128 | 21/128 | 19/128 | 17/128 |
| $x_2$ | −15 | −13 | −11 | −9 | −7 | −5 | −3 | −1 |
| $x'_2$ | 113 | 115 | 117 | 119 | 121 | 123 | 125 | 127 |
| p | 113/128 | 115/128 | 117/128 | 119/128 | 121/128 | 123/128 | 125/128 | 127/128 |
| p' | 15/128 | 13/128 | 11/128 | 9/128 | 7/128 | 5/128 | 3/128 | 1/128 |
| $x_2$ | 1 | 3 | 5 | 7 | 9 | 11 | 13 | 15 |
| $x'_2$ | −127 | −125 | −123 | −121 | −119 | −117 | −115 | −113 |
| p | 127/128 | 125/128 | 123/128 | 121/128 | 119/128 | 117/128 | 115/128 | 113/128 |
| p' | 1/128 | 3/128 | 5/128 | 7/128 | 9/128 | 11/128 | 13/128 | 15/128 |
| $x_2$ | 17 | 19 | 21 | 23 | 25 | 27 | 29 | 31 |

TABLE 6-continued

Probability Assignment for a 6-bit sub-DAC

| | | | | | | | |
|---|---|---|---|---|---|---|---|
| $x'_2$ | −111 | −109 | −107 | −105 | −103 | −101 | −99 | −97 |
| p | 111/128 | 109/128 | 107/128 | 105/128 | 103/128 | 101/128 | 99/128 | 97/128 |
| p' | 17/128 | 19/128 | 21/128 | 23/128 | 25/128 | 27/128 | 29/128 | 31/128 |
| $x_2$ | 33 | 35 | 37 | 39 | 41 | 43 | 45 | 47 |
| $x'_2$ | −95 | −93 | −91 | −89 | −87 | −85 | −83 | −81 |
| p | 95/128 | 93/128 | 91/128 | 89/128 | 87/128 | 85/128 | 83/128 | 81/128 |
| p' | 33/128 | 35/128 | 37/128 | 39/128 | 41/128 | 43/128 | 45/128 | 47/128 |
| $x_2$ | 49 | 51 | 53 | 55 | 57 | 59 | 61 | 63 |
| $x'_2$ | −79 | −77 | −75 | −73 | −71 | −69 | −67 | −65 |
| p | 79/128 | 77/128 | 75/128 | 73/128 | 71/128 | 69/128 | 67/128 | 65/128 |
| p' | 49/128 | 51/128 | 53/128 | 55/128 | 57/128 | 59/128 | 61/128 | 63/128 |

The probabilities p and p' for a 7-bit DAC are shown in Table 7.

TABLE 7

Probability Assignment for a 7-bit sub-DAC

| | | | | | | | |
|---|---|---|---|---|---|---|---|
| $x_2$ | −127 | −125 | −123 | −121 | −119 | −117 | −115 | −113 |
| $x'_2$ | 129 | 131 | 133 | 135 | 137 | 139 | 141 | 143 |
| p | 129/256 | 131/256 | 133/256 | 135/256 | 137/256 | 139/256 | 141/256 | 143/256 |
| p' | 127/256 | 125/256 | 123/256 | 121/256 | 119/256 | 117/256 | 115/256 | 113/256 |
| $x_2$ | −111 | −109 | −107 | −105 | −103 | −101 | −99 | −97 |
| $x'_2$ | 145 | 147 | 149 | 151 | 153 | 155 | 157 | 159 |
| p | 145/256 | 147/256 | 149/256 | 151/256 | 153/256 | 155/256 | 157/256 | 159/256 |
| p' | 111/256 | 109/256 | 107/256 | 105/256 | 103/256 | 101/256 | 99/256 | 97/256 |
| $x_2$ | −95 | −93 | −91 | −89 | −87 | −85 | −83 | −81 |
| $x'_2$ | 161 | 163 | 165 | 167 | 169 | 171 | 173 | 175 |
| p | 161/256 | 163/256 | 165/256 | 167/256 | 169/256 | 171/256 | 173/256 | 175/256 |
| p' | 95/256 | 93/256 | 91/256 | 89/256 | 87/256 | 85/256 | 83/256 | 81/256 |
| $x_2$ | −79 | −77 | −75 | −73 | −71 | −69 | −67 | −65 |
| $x'_2$ | 177 | 179 | 181 | 183 | 185 | 187 | 189 | 191 |
| p | 177/256 | 179/256 | 181/256 | 183/256 | 185/256 | 187/256 | 189/256 | 191/256 |
| p' | 79/256 | 77/256 | 75/256 | 73/256 | 71/256 | 69/256 | 67/256 | 65/256 |
| $x_2$ | −63 | −61 | −59 | −57 | −55 | −53 | −51 | −49 |
| $x'_2$ | 193 | 195 | 197 | 199 | 201 | 203 | 205 | 207 |
| p | 193/256 | 195/256 | 197/256 | 199/256 | 201/256 | 203/256 | 205/256 | 207/256 |
| p' | 63/256 | 61/256 | 59/256 | 57/256 | 55/256 | 53/256 | 51/256 | 49/256 |
| $x_2$ | −47 | −45 | −43 | −41 | −39 | −37 | −35 | −33 |
| $x'_2$ | 209 | 211 | 213 | 215 | 217 | 219 | 221 | 223 |
| p | 209/256 | 211/256 | 213/256 | 215/256 | 217/256 | 219/256 | 221/256 | 223/256 |
| p' | 47/256 | 45/256 | 43/256 | 41/256 | 39/256 | 37/256 | 35/256 | 33/256 |
| $x_2$ | −31 | −29 | −27 | −25 | −23 | −21 | −19 | −17 |
| $x'_2$ | 225 | 227 | 229 | 231 | 233 | 235 | 237 | 239 |
| p | 225/256 | 227/256 | 229/256 | 231/256 | 233/256 | 235/256 | 237/256 | 239/256 |
| p' | 31/256 | 29/256 | 27/256 | 25/256 | 23/256 | 21/256 | 19/256 | 17/256 |
| $x_2$ | −15 | −13 | −11 | −9 | −7 | −5 | −3 | −1 |
| $x'_2$ | 241 | 243 | 245 | 247 | 249 | 251 | 253 | 255 |
| p | 241/256 | 243/256 | 245/256 | 247/256 | 249/256 | 251/256 | 253/256 | 255/256 |
| p' | 15/256 | 13/256 | 11/256 | 9/256 | 7/256 | 5/256 | 3/256 | 1/256 |
| $x_2$ | 1 | 3 | 5 | 7 | 9 | 11 | 13 | 15 |
| $x'_2$ | −255 | −253 | −251 | −249 | −247 | −245 | −243 | −241 |
| p | 255/256 | 253/256 | 251/256 | 249/256 | 247/256 | 245/256 | 243/256 | 241/256 |
| p' | 1/256 | 3/256 | 5/256 | 7/256 | 9/256 | 11/256 | 13/256 | 15/256 |
| $x_2$ | 17 | 19 | 21 | 23 | 25 | 27 | 29 | 31 |
| $x'_2$ | −239 | −237 | −235 | −233 | −231 | −229 | −227 | −225 |
| p | 239/256 | 237/256 | 235/256 | 233/256 | 231/256 | 229/256 | 227/256 | 225/256 |
| p' | 17/256 | 19/256 | 21/256 | 23/256 | 25/256 | 27/256 | 29/256 | 31/256 |
| $x_2$ | 33 | 35 | 37 | 39 | 41 | 43 | 45 | 47 |
| $x'_2$ | −223 | −221 | −219 | −217 | −215 | −213 | −211 | −209 |
| p | 223/256 | 221/256 | 219/256 | 217/256 | 215/256 | 213/256 | 211/256 | 209/256 |
| p' | 33/256 | 35/256 | 37/256 | 39/256 | 41/256 | 43/256 | 45/256 | 47/256 |
| $x_2$ | 49 | 51 | 53 | 55 | 57 | 59 | 61 | 63 |
| $x'_2$ | −207 | −205 | −203 | −201 | −199 | −197 | −195 | −193 |
| p | 207/256 | 205/256 | 203/256 | 201/256 | 199/256 | 197/256 | 195/256 | 193/256 |
| p' | 49/256 | 51/256 | 53/256 | 55/256 | 57/256 | 59/256 | 61/256 | 63/256 |
| $x_2$ | 65 | 67 | 69 | 71 | 73 | 75 | 77 | 79 |
| $x'_2$ | −191 | −189 | −187 | −185 | −183 | −181 | −179 | −177 |
| p | 191/256 | 189/256 | 187/256 | 185/256 | 183/256 | 181/256 | 179/256 | 177/256 |
| p' | 65/256 | 67/256 | 69/256 | 71/256 | 73/256 | 75/256 | 77/256 | 79/256 |
| $x_2$ | 81 | 83 | 85 | 87 | 89 | 91 | 93 | 95 |
| $x'_2$ | −175 | −173 | −171 | −169 | −167 | −165 | −163 | −161 |
| p | 175/256 | 173/256 | 171/256 | 169/256 | 167/256 | 165/256 | 163/256 | 161/256 |
| p' | 81/256 | 83/256 | 85/256 | 87/256 | 89/256 | 91/256 | 93/256 | 95/256 |

TABLE 7-continued

Probability Assignment for a 7-bit sub-DAC

| $x_2$ | 97 | 99 | 101 | 103 | 105 | 107 | 109 | 111 |
|---|---|---|---|---|---|---|---|---|
| $x'_2$ | −159 | −157 | −155 | −153 | −151 | −149 | −147 | −145 |
| p | 159/256 | 157/256 | 155/256 | 153/256 | 151/256 | 149/256 | 147/256 | 145/256 |
| p' | 97/256 | 99/256 | 101/256 | 103/256 | 105/256 | 107/256 | 109/256 | 111/256 |
| $x_2$ | 113 | 115 | 117 | 119 | 121 | 123 | 125 | 127 |
| $x'_2$ | −143 | −141 | −139 | −137 | −135 | −133 | −131 | −129 |
| p | 143/256 | 141/256 | 139/256 | 137/256 | 135/256 | 133/256 | 131/256 | 129/256 |
| p' | 113/256 | 115/256 | 117/256 | 119/256 | 121/256 | 123/256 | 125/256 | 127/256 |

The probabilities p and p' for a 8-bit DAC are shown in Table 8.

TABLE 8

Probability Assignment for a 8-bit sub-DAC

| $x_2$ | −255 | −253 | −251 | −249 | −247 | −245 | −243 | −241 |
|---|---|---|---|---|---|---|---|---|
| $x'_2$ | 257 | 259 | 261 | 263 | 265 | 267 | 269 | 271 |
| p | 257/512 | 259/512 | 261/512 | 263/512 | 265/512 | 267/512 | 269/512 | 271/512 |
| p' | 255/512 | 253/512 | 251/512 | 249/512 | 247/512 | 245/512 | 243/512 | 241/512 |
| $x_2$ | −239 | −237 | −235 | −233 | −231 | −229 | −227 | −225 |
| $x'_2$ | 273 | 275 | 277 | 279 | 281 | 283 | 285 | 287 |
| p | 273/512 | 275/512 | 277/512 | 279/512 | 281/512 | 283/512 | 285/512 | 287/512 |
| p' | 239/512 | 237/512 | 235/512 | 233/512 | 231/512 | 229/512 | 227/512 | 225/512 |
| $x_2$ | −223 | −221 | −219 | −217 | −215 | −213 | −211 | −209 |
| $x'_2$ | 289 | 291 | 293 | 295 | 297 | 299 | 301 | 303 |
| p | 289/512 | 291/512 | 293/512 | 295/512 | 297/512 | 299/512 | 301/512 | 303/512 |
| p' | 223/512 | 221/512 | 219/512 | 217/512 | 215/512 | 213/512 | 211/512 | 209/512 |
| $x_2$ | −207 | −205 | −203 | −201 | −199 | −197 | −195 | −193 |
| $x'_2$ | 305 | 307 | 309 | 311 | 313 | 315 | 317 | 319 |
| p | 305/512 | 307/512 | 309/512 | 311/512 | 313/512 | 315/512 | 317/512 | 319/512 |
| p' | 207/512 | 205/512 | 203/512 | 201/512 | 199/512 | 197/512 | 195/512 | 193/512 |
| $x_2$ | −191 | −189 | −187 | −185 | −183 | −181 | −179 | −177 |
| $x'_2$ | 321 | 323 | 325 | 327 | 329 | 331 | 333 | 335 |
| p | 321/512 | 323/512 | 325/512 | 327/512 | 329/512 | 331/512 | 333/512 | 335/512 |
| p' | 191/512 | 189/512 | 187/512 | 185/512 | 183/512 | 181/512 | 179/512 | 177/512 |
| $x_2$ | −175 | −173 | −171 | −169 | −167 | −165 | −163 | −161 |
| $x'_2$ | 337 | 339 | 341 | 343 | 345 | 347 | 349 | 351 |
| p | 337/512 | 339/512 | 341/512 | 343/512 | 345/512 | 347/512 | 349/512 | 351/512 |
| p' | 175/512 | 173/512 | 171/512 | 169/512 | 167/512 | 165/512 | 163/512 | 161/512 |
| $x_2$ | −159 | −157 | −155 | −153 | −151 | −149 | −147 | −145 |
| $x'_2$ | 353 | 355 | 357 | 359 | 361 | 363 | 365 | 367 |
| p | 353/512 | 355/512 | 357/512 | 359/512 | 361/512 | 363/512 | 365/512 | 367/512 |
| p' | 159/512 | 157/512 | 155/512 | 153/512 | 151/512 | 149/512 | 147/512 | 145/512 |
| $x_2$ | −143 | −141 | −139 | −137 | −135 | −133 | −131 | −129 |
| $x'_2$ | 369 | 371 | 373 | 375 | 377 | 379 | 381 | 383 |
| p | 369/512 | 371/512 | 373/512 | 375/512 | 377/512 | 379/512 | 381/512 | 383/512 |
| p' | 143/512 | 141/512 | 139/512 | 137/512 | 135/512 | 133/512 | 131/512 | 129/512 |
| $x_2$ | −127 | −125 | −123 | −121 | −119 | −117 | −115 | −113 |
| $x'_2$ | 385 | 387 | 389 | 391 | 393 | 395 | 397 | 399 |
| p | 385/512 | 387/512 | 389/512 | 391/512 | 393/512 | 395/512 | 397/512 | 399/512 |
| p' | 127/512 | 125/512 | 123/512 | 121/512 | 119/512 | 117/512 | 115/512 | 113/512 |
| $x_2$ | −111 | −109 | −107 | −105 | −103 | −101 | −99 | −97 |
| $x'_2$ | 401 | 403 | 405 | 407 | 409 | 411 | 413 | 415 |
| p | 401/512 | 403/512 | 405/512 | 407/512 | 409/512 | 411/512 | 413/512 | 415/512 |
| p' | 111/512 | 109/512 | 107/512 | 105/512 | 103/512 | 101/512 | 99/512 | 97/512 |
| $x_2$ | −95 | −93 | −91 | −89 | −87 | −85 | −83 | −81 |
| $x'_2$ | 417 | 419 | 421 | 423 | 425 | 427 | 429 | 431 |
| p | 417/512 | 419/512 | 421/512 | 423/512 | 425/512 | 427/512 | 429/512 | 431/512 |
| p' | 95/512 | 93/512 | 91/512 | 89/512 | 87/512 | 85/512 | 83/512 | 81/512 |
| $x_2$ | −79 | −77 | −75 | −73 | −71 | −69 | −67 | −65 |
| $x'_2$ | 433 | 435 | 437 | 439 | 441 | 443 | 445 | 447 |
| p | 433/512 | 435/512 | 437/512 | 439/512 | 441/512 | 443/512 | 445/512 | 447/512 |
| p' | 79/512 | 77/512 | 75/512 | 73/512 | 71/512 | 69/512 | 67/512 | 65/512 |
| $x_2$ | −63 | −61 | −59 | −57 | −55 | −53 | −51 | −49 |
| $x'_2$ | 449 | 451 | 453 | 455 | 457 | 459 | 461 | 463 |
| p | 449/512 | 451/512 | 453/512 | 455/512 | 457/512 | 459/512 | 461/512 | 463/512 |
| p' | 63/512 | 61/512 | 59/512 | 57/512 | 55/512 | 53/512 | 51/512 | 49/512 |
| $x_2$ | −47 | −45 | −43 | −41 | −39 | −37 | −35 | −33 |
| $x'_2$ | 465 | 467 | 469 | 471 | 473 | 475 | 477 | 479 |
| p | 465/512 | 467/512 | 469/512 | 471/512 | 473/512 | 475/512 | 477/512 | 479/512 |
| p' | 47/512 | 45/512 | 43/512 | 41/512 | 39/512 | 37/512 | 35/512 | 33/512 |
| $x_2$ | −31 | −29 | −27 | −25 | −23 | −21 | −19 | −17 |
| $x'_2$ | 481 | 483 | 485 | 487 | 489 | 491 | 493 | 495 |
| p | 481/512 | 483/512 | 485/12 | 487/512 | 489/512 | 491/512 | 493/512 | 495/512 |

TABLE 8-continued

Probability Assignment for a 8-bit sub-DAC

| | | | | | | | | |
|---|---|---|---|---|---|---|---|---|
| p' | 31/512 | 29/512 | 27/512 | 25/512 | 23/512 | 21/512 | 19/512 | 17/512 |
| $x_2$ | −15 | −13 | −11 | −9 | −7 | −5 | −3 | −1 |
| $x'_2$ | 497 | 499 | 501 | 503 | 505 | 507 | 509 | 511 |
| p | 497/512 | 499/512 | 501/512 | 503/512 | 505/512 | 507/512 | 509/512 | 511/512 |
| p' | 15/512 | 13/512 | 11/512 | 9/512 | 7/512 | 5/512 | 3/512 | 1/512 |
| $x_2$ | 1 | 3 | 5 | 7 | 9 | 11 | 13 | 15 |
| $x'_2$ | −511 | −509 | −507 | −505 | −503 | −501 | −499 | −497 |
| p | 511/512 | 509/512 | 507/512 | 505/512 | 503/512 | 501/512 | 499/512 | 497/512 |
| p' | 1/512 | 3/512 | 5/512 | 7/512 | 9/512 | 11/512 | 13/512 | 15/512 |
| $x_2$ | 17 | 19 | 21 | 23 | 25 | 27 | 29 | 31 |
| $x'_2$ | −495 | −493 | −491 | −489 | −487 | −485 | −483 | −481 |
| p | 495/512 | 493/512 | 491/512 | 489/512 | 487/512 | 485/512 | 483/512 | 481/512 |
| p' | 17/512 | 19/512 | 21/512 | 23/512 | 25/512 | 27/512 | 29/512 | 31/512 |
| $x_2$ | 33 | 35 | 37 | 39 | 41 | 43 | 45 | 47 |
| $x'_2$ | −479 | −477 | −475 | −473 | −471 | −469 | −467 | −465 |
| p | 479/512 | 477/512 | 475/512 | 473/512 | 471/512 | 469/512 | 467/512 | 465/512 |
| p' | 33/512 | 35/512 | 37/512 | 39/512 | 41/512 | 43/512 | 45/512 | 47/512 |
| $x_2$ | 49 | 51 | 53 | 55 | 57 | 59 | 61 | 63 |
| $x'_2$ | −463 | −461 | −459 | −457 | −455 | −453 | −451 | −449 |
| p | 463/512 | 461/512 | 459/512 | 457/512 | 455/512 | 453/512 | 451/512 | 449/512 |
| p' | 49/512 | 51/512 | 53/512 | 55/512 | 57/512 | 59/512 | 61/512 | 63/512 |
| $x_2$ | 65 | 67 | 69 | 71 | 73 | 75 | 77 | 79 |
| $x'_2$ | −447 | −445 | −443 | −441 | −439 | −437 | −435 | −433 |
| p | 447/512 | 445/512 | 443/512 | 441/512 | 439/512 | 437/512 | 435/512 | 433/512 |
| p' | 65/512 | 67/512 | 69/512 | 71/512 | 73/512 | 75/512 | 77/512 | 79/512 |
| $x_2$ | 81 | 83 | 85 | 87 | 89 | 91 | 93 | 95 |
| $x'_2$ | −431 | −429 | −427 | −425 | −423 | −421 | −419 | −417 |
| p | 431/512 | 429/512 | 427/512 | 425/512 | 423/512 | 421/512 | 419/512 | 417/512 |
| p' | 81/512 | 83/512 | 85/512 | 87/512 | 89/512 | 91/512 | 93/512 | 95/512 |
| $x_2$ | 97 | 99 | 101 | 103 | 105 | 107 | 109 | 111 |
| $x'_2$ | −415 | −413 | −411 | −409 | −407 | −405 | −403 | −401 |
| p | 415/512 | 413/512 | 411/512 | 409/512 | 407/512 | 405/512 | 403/512 | 401/512 |
| p' | 97/512 | 99/512 | 101/512 | 103/512 | 105/512 | 107/512 | 109/512 | 111/512 |
| $x_2$ | 113 | 115 | 117 | 119 | 121 | 123 | 125 | 127 |
| $x'_2$ | −399 | −397 | −395 | −393 | −391 | −389 | −387 | −385 |
| p | 399/512 | 397/512 | 395/512 | 393/512 | 391/512 | 389/512 | 387/512 | 385/512 |
| p' | 113/512 | 115/512 | 117/512 | 119/512 | 121/512 | 123/512 | 125/512 | 127/512 |
| $x_2$ | 129 | 131 | 133 | 135 | 137 | 139 | 141 | 143 |
| $x'_2$ | −383 | −381 | −379 | −377 | −375 | −373 | −371 | −369 |
| p | 383/512 | 381/512 | 379/512 | 377/512 | 375/512 | 373/512 | 371/512 | 369/512 |
| p' | 129/512 | 131/512 | 133/512 | 135/512 | 137/512 | 139/512 | 141/512 | 143/512 |
| $x_2$ | 145 | 147 | 149 | 151 | 153 | 155 | 157 | 159 |
| $x'_2$ | −367 | −365 | −363 | −361 | −359 | −357 | −355 | −353 |
| p | 367/512 | 365/512 | 363/512 | 361/512 | 359/512 | 357/512 | 355/512 | 353/512 |
| p' | 145/512 | 147/512 | 149/512 | 151/512 | 153/512 | 155/512 | 157/512 | 159/512 |
| $x_2$ | 161 | 163 | 165 | 167 | 169 | 171 | 173 | 175 |
| $x'_2$ | −351 | −349 | −347 | −345 | −343 | −341 | −339 | −337 |
| p | 351/512 | 349/512 | 347/512 | 345/512 | 343/512 | 341/512 | 339/512 | 337/512 |
| p' | 161/512 | 163/512 | 165/512 | 167/512 | 169/512 | 171/512 | 173/512 | 175/512 |
| $x_2$ | 177 | 179 | 181 | 183 | 185 | 187 | 189 | 191 |
| $x'_2$ | −335 | −333 | −331 | −329 | −327 | −325 | −323 | −321 |
| p | 335/512 | 333/512 | 331/512 | 329/512 | 327/512 | 325/512 | 323/512 | 321/512 |
| p' | 177/512 | 179/512 | 181/512 | 183/512 | 185/512 | 187/512 | 189/512 | 191/512 |
| $x_2$ | 193 | 195 | 197 | 199 | 201 | 203 | 205 | 207 |
| $x'_2$ | −319 | −317 | −315 | −313 | −311 | −309 | −307 | −305 |
| p | 319/512 | 317/512 | 315/512 | 313/512 | 311/512 | 309/512 | 307/512 | 305/512 |
| p' | 193/512 | 195/512 | 197/512 | 199/512 | 201/512 | 203/512 | 205/512 | 207/512 |
| $x_2$ | 209 | 211 | 213 | 215 | 217 | 219 | 221 | 223 |
| $x'_2$ | −303 | −301 | −299 | −297 | −295 | −293 | −291 | −289 |
| p | 303/512 | 301/512 | 299/512 | 297/512 | 295/512 | 293/512 | 291/512 | 289/512 |
| p' | 209/512 | 211/512 | 213/512 | 215/512 | 217/512 | 219/512 | 221/512 | 223/512 |
| $x_2$ | 225 | 227 | 229 | 231 | 233 | 235 | 237 | 239 |
| $x'_2$ | −287 | −285 | −283 | −281 | −279 | −277 | −275 | −273 |
| p | 287/512 | 285/512 | 283/512 | 281/512 | 279/512 | 277/512 | 275/512 | 273/512 |
| p' | 225/512 | 227/512 | 229/512 | 231/512 | 233/512 | 235/512 | 237/512 | 239/512 |
| $x_2$ | 241 | 243 | 245 | 247 | 249 | 251 | 253 | 255 |
| $x'_2$ | −271 | −269 | −267 | −265 | −263 | −261 | −259 | −257 |
| p | 271/512 | 269/512 | 267/512 | 265/512 | 263/512 | 261/512 | 259/512 | 257/512 |
| p' | 241/512 | 243/512 | 245/512 | 247/512 | 249/512 | 251/512 | 253/512 | 255/512 |

The redundancy mapping and probability assignment is given by:

$$(u, v) = \begin{cases} (x_1, x_2) \text{ with probability } p \\ (x_1', x_2') \text{ with probability } p' \end{cases}$$

In several embodiments, pseudo-random numbers can be generated using Linear Feedback Shift Registers (LFSR). The L-bits in an L-bit LFSR represent a "state" and for properly designed feedback polynomials, the LFSR will cycle sequentially through 2L−1 states before repeating itself. Typically, the all-zeros or all-ones state is disallowed. By choosing a sufficiently large L, each bit in the LFSR assumes a '0' or a '1' with probability of ½. Thus, uniformly distributed random numbers can be generated by grouping together several bits of the LFSR. For example, four bits of the LFSR together represent a uniformly distributed random integer variable $R \in [0:15]$ with uniform pdf of ¹⁄₁₆. That is, Prob(R<1)=¹⁄₁₆, Prob(R<3)=³⁄₁₆, Prob(R<5)=⁵⁄₁₆, Prob(R<7)=⁷⁄₁₆ and so on. The probability assignment with probabilities p and p' can be implemented by associating the selection with the outcome of the comparison between the random integer R and $|x_2|$ as follows:

$$(u, v) = \begin{cases} (x_1, x_2) \text{ with probability } p = 1 - p' \\ (x_1', x_2') \text{ with probability } p' = Prob(R < |x_2|) \end{cases}$$

The peak amplitude of the input should be reduced such that the all zeros and all one's binary codes are never encountered in the MSB sub-DAC. This ensures that both $x_1$ and $x_1'$ can be represented by a $B_1$-bit word with no overflows. The ranges before and after mapping are given by:

$$x_1 \in [-N_1+2:2: N_1-2]$$

$$x_1' \in [-N_1+1:2:N_1-1]$$

and $$x_2 \in [-N_2+1:2: N_2-1]$$

$$x_2' \in [-2N_2+1:2: -N_2-1] \cup [N_2+1:2:2N-1]$$

For a 3-bit sub-DAC, as shown in FIG. 17, $x_2 \in [-7,-5,-3,-1,1,3,5,7]$ and $x_2' \in [-15,-13,-11,-9] \cup [9,11,13,15]$. The normal and redundant representations do not overlap. But the range of x has doubled. Both $x_2$ and $x_2'$ can be implemented with a $(B_2+1)$-bit sub-DAC with $2N_2-1$ unit elements.

An extension to multi-segment DACs is described below. In an m-segment DAC, the input digital word x is decomposed into m-segments $x_1, x_2, \ldots x_m$. The mapping is defined as:

$$x \rightarrow (x_1, x_2, \ldots, x_m)$$

The redundant mapping is given by:

$$v \rightarrow (v_1, v_2, \ldots, v_m)$$

A variable is first defined as:

$$x_{k,m} \rightarrow (x_k, x_{k+1}, \ldots, x_m)$$

The value of $x_{k,m}$ is determined by segments k through m. That is:

$$x_{k,m} \rightarrow x_k + \frac{x_{k+1}}{N_k} + \cdots + \frac{x_m}{N_k \cdots N_m}$$

Based on the nested nature of the computations defined in Eqn. (6), the redundancy mapping can be performed sequentially over pairs of segments, commencing at the last segment $x_m$ and concluding at the first segment $x_1$, as follows.

The computation for segment (m−1)-to-m is:

$$(x_{m-1}, x_m) \xrightarrow{maps\ to} (u_{m-1}, v_m)$$

where $$(u_{m-1}, v_m) = \begin{cases} (x_{m-1}, x_m) \text{ with probability } p_{m-1} \\ (x_{m-1}', x_m') \text{ with probability } p_{m-1}' \end{cases}$$

and $u_{m-1}$ is an intermediate value to be used in the computation.

$$x_{m-1}' = x_{m-1} + \delta x_{m-1} \cdot \text{sgn}(x_m)$$

$$x_m' = x_m - N_m \cdot \delta x_{m-1} \cdot \text{sgn}(x_m)$$

$$p_{m-1}' = 1 - p_{m-1} = \frac{|x_m|}{N_m \cdot \delta x_{m-1}}$$

The computation for segment (k−1)-to-k is:

$$(x_{k-1}, u_k) \xrightarrow{maps\ to} (u_{k-1}, v_k)$$

where $$(u_{k-1}, v_k) = \begin{cases} (x_{k-1}, u_k) \text{ with probability } p_{k-1} \\ (x_{k-1}', u_k') \text{ with probability } p_{k-1}' \end{cases} \text{ and }$$

$$x_{k-1}' = x_{k-1} + \delta x_{k-1} \cdot \text{sgn}(x_{k,m})$$

$$u_k' = u_k - N_k \cdot \delta x_{k-1} \cdot \text{sgn}(x_{k,m})$$

$$p_{k-1}' = 1 - p_{k-1} = \frac{|u_k|}{N_k \cdot \delta x_{k-1}}$$

The recursive procedure ends when k=2 and $(u_1, v_2)$ is mapped. Assign $v_1 = u_1$ and $(v_1, v_2, \ldots, v_m)$ is the final vector for the multi-segment DAC.

Figure 18:
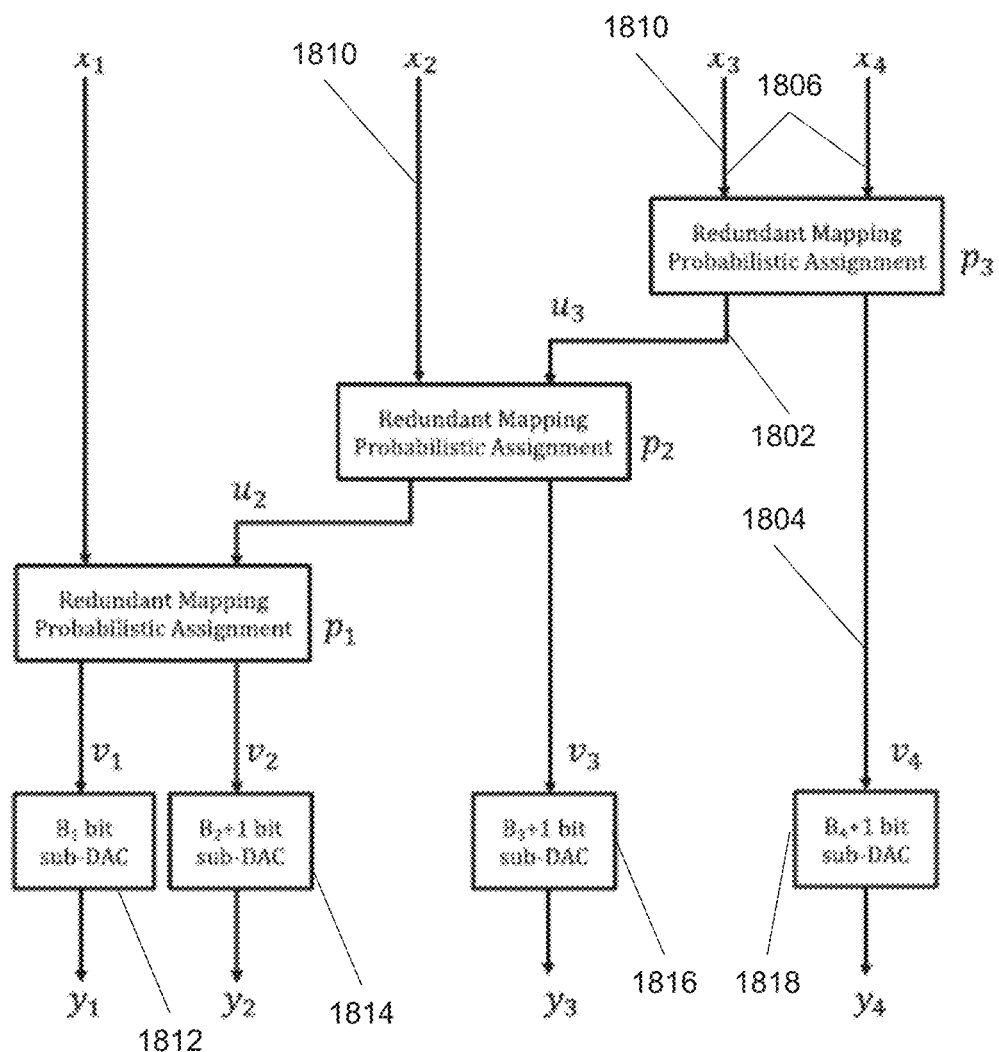
FIG. 18 is a schematic view of an implementation of four-segment linearization utilizing sequential pairwise operations according to an embodiment of the invention.

The sequential pairwise operations are shown in FIG. 18. Every intermediate segment 1810 undergoes two mappings $x_k \rightarrow u_k \rightarrow v_k$, the first mapping 1802 as an MSB segment 1806 and the second mapping 1804 as an LSB segment of the two-segment pair 1806.

The resolution of the main MSB sub-DAC 1812 remains unchanged. However, the resolution of all other sub-DACs 1814, 1816, 1818 is increased by one bit. The unit elements of all the LSB sub-DACs 1814, 1816, 1818 add up to one LSB of the MSB sub-DAC 1812 based on the binary nature of the input decomposition. Therefore, the increase in complexity is equivalent to only one LSB of the MSB sub-DAC 1812. For example, for a design with a 4-bit MSB sub-DAC, the increase in hardware complexity may only be 6.25%.

An extension to binary DACs will now be discussed. A B-bit binary DAC requires B binary weighted elements. To achieve perfect linearity, ratios between weighted elements can be powers of 2. Any deviation from power of 2 ratios can result in DNL and INL error.

A B-bit binary DAC can be treated as a segmented DAC with B segments $x_2, \ldots, x_B$. Each segment has 1 bit where $x_i$ takes values −1 and 1. The B-bit digital input x can be expressed as binary weighted summation of $x_i$:

$$x = x_1 + \frac{x_2}{2^1} + \frac{x_3}{2^2} + \ldots + \frac{x_B}{2^{B-1}}$$

The output of the DAC can be expressed as follows:

$$\bar{y} = \bar{y}_1 + \frac{\bar{y}_2}{2^1} + \frac{\bar{y}_3}{2^2} + \ldots + \frac{\bar{y}_B}{2^{B-1}}$$

In the case of non-ideal implementation $\bar{y}_i = x_1 \cdot (1+\alpha_i)$, where $\alpha_i$ is the ratio error for segment i. The output of the DAC is given by:

$$\bar{y} = x_1 \cdot (1+\alpha_1) + \frac{x_2 \cdot (1+\alpha_2)}{2^1} + \frac{x_3 \cdot (1+\alpha_3)}{2^2} + \ldots + \frac{x_B \cdot (1+\alpha_B)}{2^{B-1}}$$

In redundant mappings DAC implementations, each 1-bit segment is replaced by 2-bit thermometer-coded segments. There are B segments $v_p, v_2, \ldots v_B$. Each segment comprises, or alternatively consists of, 3 unit elements where $v_i$ takes value −3, −1, 1, and 3. Segments $v_p, v_2, \ldots v_B$ can be determined with the recursive procedure starting from the last segment $v_b$, as follows.

The computation for segment (B-1)-to-B is:

$$(x_{B-1}, x_B) \xrightarrow{maps\ to} (u_{B-1}, v_B)$$

where $$(u_{B-1}, v_B) = \begin{cases} (x_{B-1}, x_B) & \text{with probability } p_{B-1} \\ (x'_{B-1}, x'_B) & \text{with probability } p'_{B-1} \end{cases}$$

and $u_{B-1}$ is an intermediate value to be used in the next computation:

$$x'_{B-1} = x_{B-1} + 2 \cdot \text{sgn}(x_B)$$
$$x'_B = x_B - 4 \cdot \text{sgn}(x_B)$$
$$p'_{B-1} = 1 - p_{B-1} = \frac{|x_B|}{4}$$
$$v_{B,B} = \frac{v_B}{2}$$

The computation for segment (k−1)-to-k is:

$$(x_{k-1}, u_k) \xrightarrow{maps\ to} (u_{k-1}, v_k)$$

where $$(u_{k-1}, v_k) = \begin{cases} (x_{k-1}, u_k) & \text{with probability } p_{k-1} \\ (x'_{k-1}, u'_k) & \text{with probability } p'_{k-1} \end{cases}$$

and $u_{k-1}$ is an intermediate value to be used in the next substitution:

$$x'_{k-1} = x_{k-1} + 2 \cdot \text{sgn}(u_k + v_{k+1,B})$$
$$u'_k = u_k - 4 \cdot \text{sgn}(u_k + v_{k+1,B})$$
$$p'_{k-1} = 1 - p_{k-1} = \frac{|u_k + v_{k+1,B}|}{4}$$
$$v_{k,B} = \frac{v_k + v_{k+1,B}}{2}$$

The recursive procedure ends when k=2 and $(u_1, v_2)$ is mapped. Assign $v_1 = u_1$ and $(v_1, v_2, \ldots, v_B)$ is the final vector for the B segments DAC.

Accordingly, in many embodiments, a redundancy mapping probabilistic assignment can provide for more linear DACs. In particular, the linearization may not depend on component mismatches and the DAC can be linear by design. Thus, no information about the mismatches may be needed. However, the mismatches can be converted to random noise that is distributed evenly over the Nyquist band. The linearization can be feed-forward and occur in the digital domain. In many embodiments, linearity can be maintained over process, temperature and voltage variations.

Successive Approximation Register ADCs

The approach of the present embodiments includes an application to Successive Approximation Register (SAR) ADCs. The SAR ADC represents a significant portion of the medium to high resolution ADC market. Typical resolutions range from 10 to 18 bits with speeds up to 20 MS/s. The SAR architecture results in low power consumption and small area and is the architecture of choice for a wide variety of applications. Recently, lower resolution time-interleaved SARs have resulted in very efficient multi-gigasample ADCs.

A B-bit flash ADC uses a linear voltage ladder with a comparator at each of the N "rungs" of the ladder to simultaneously compare the input voltage to a set of equally spaced reference voltages. The output of these comparators is fed to a digital encoder which generates a binary value. The flash architecture is a highly parallel architecture with a fast conversion time of one cycle. The principal drawback is that the complexity typically increases exponentially with the number of bits since the B-bit ADC utilizes N reference voltages and N comparators.

At the other end of the spectrum is a digital ramp (counter) B-bit ADC that takes up to N cycles for conversion. The ramp counter increments by one LSB at each count. The B-bit count drives a DAC whose output is compared with the analog input. The counting process is terminated when the DAC output exceeds the analog input. While the architecture can highly sequential and may use only one comparator and a DAC, the sequential nature can result in exponentially slower conversion rates for high resolution ADCs.

Figure 19:
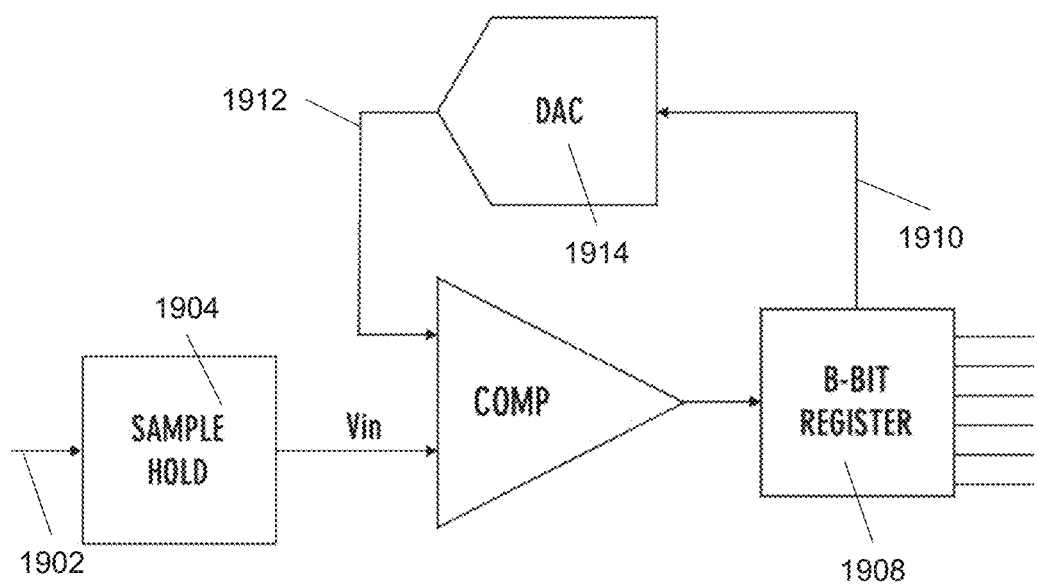
FIG. 19 is an architecture of a B-bit Successive Approximation Register ADC according to an embodiment of the invention.

An architecture of a B-bit SAR ADC, in accordance with an embodiment of the invention is illustrated in FIG. 19. The analog input voltage Vin 1902 is sampled and held 1904 for the duration of the conversion. A decision-directed search algorithm 1908 can sequentially select B-bit digital inputs 1910 that drive the output 1912 of the DAC 1904 to a value that is closest to the input voltage Vin. It is well known that a binary search algorithm may be the most efficient search and finds the closest code in B=log 2(N) steps.

Figure 20:
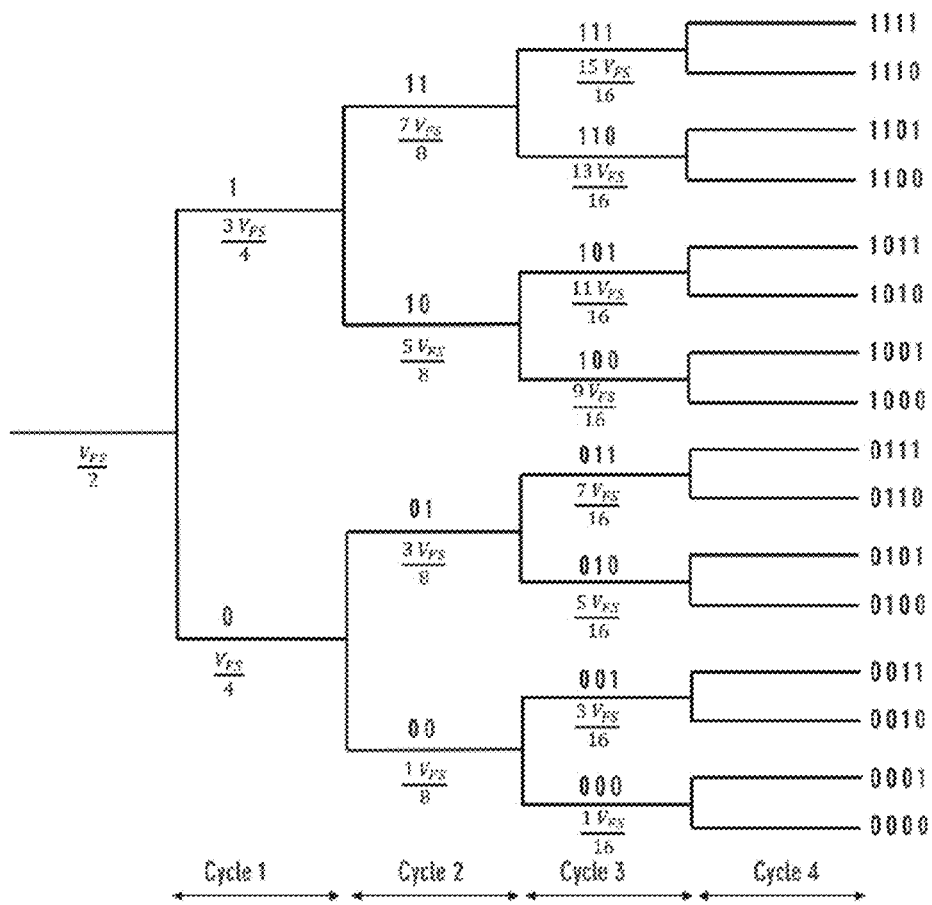
FIG. 20 is a representation of the generation of SAR register values in a four-bit SAR Time Trellis from DAC voltages according to an embodiment of the invention.

The successive approximation register can be initialized so that only the most significant bit (MSB) is equal to a digital 1. This code can be fed to the DAC which supplies the analog equivalent $$\left(\frac{V_{FS}}{2}\right)$$

of this digital code to the comparator for comparison with the sampled input voltage. If this analog voltage exceeds Vin, the comparator can cause the SAR to reset this bit; otherwise, the bit is left at 1. Then the next bit is set to 1 and the DAC supplies the analog equivalent of the digital code as $$\left(\frac{3V_{FS}}{4}\right) \text{ or } \left(\frac{4V_{FS}}{4}\right)$$

as shown in FIG. 20. Thus, in each cycle the ADC compares Vin with the most recent analog estimate and directs the search according to the polarity of the comparison. The binary search can be continued until every bit in the SAR has been exercised. The resulting code is the digital approximation of the sampled input voltage. Although FIG. 19 illustrates a particular B-bit SAR ADC architecture, any of a variety of SAR ADC architectures may be utilized as appropriate to the requirements of specific applications in accordance with embodiments of the invention.

Two important components of SAR ADCs implemented in accordance with various embodiments of the invention are the comparator and the DAC. The Sample and Hold block can typically be embedded in the DAC (for example in a Capacitive DAC) and may not be an explicit circuit. The noise in the comparator can be considered white and is not a source of nonlinearity. However, in the absence of amplification, the comparator may need to maintain an accuracy of B-bits, so the input referred noise of the comparator can be designed to be less than an LSB.

The SAR can create a "virtual" voltage reference ladder where each voltage rung is generated sequentially by the DAC. If the voltages generated by the DAC are not uniformly spaced apart, this can result in unequal step sizes (or bins) and the signal can be non-uniformly quantized. DNL is a measure of the difference of each step size from the nominal step size.

Typically, the DAC output as a function of time is monitored, and all its possible trajectories are mapped. These trajectories form a "time trellis" as shown in FIG. 20. The last stage of this time trellis may comprise, or in some embodiments consists of, a set of voltages that are uniformly spaced apart over the input voltage range. The linearity of the ADC can be a function of how accurately the DAC can generate this set of equally spaced voltages. Thus, the linearity of the ADC can be determined solely by the linearity of the DAC.

High resolution SAR ADCs tend to occupy a large area if the DAC unit element size is dictated by matching requirements for linearity rather than by thermal noise. Based on limitations on component matching (capacitor, resistor, current sources) high resolution SAR DACs may require trimming. However, trimming may not compensate for changes with voltage and temperature. Hence, on-line continuous calibration may be necessary during the normal operation.

Most DACs may use a segmented architecture to reduce the complexity. While DEM is typically used to linearize the MSB segment, mismatches in the bridge capacitor and the between capacitors in the coarse and fine segments gives rise to nonlinearities.

A DAC employing redundancy mapping and probabilistic assignment may be perfectly linear. Therefore, the redundant mappings DAC generates a set of reference voltages that are uniformly spaced apart which results in a perfectly linear ADC. The redundant mappings architecture can also maintain linearity continuously over process, temperature and/or voltage variations.

The components may be implemented by one or more processors or computers. It will be apparent that systems and/or methods, described herein, may be implemented in different forms of hardware, firmware, or a combination of hardware and software. The actual specialized control hardware or software code used to implement these systems and/or methods is not limiting of the implementations. Thus, the operation and behavior of the systems and/or methods were described herein without reference to specific software code—it being understood that software and hardware can be designed to implement the systems and/or methods based on the description herein.

The present invention may have also been described, at least in part, in terms of one or more embodiments. An embodiment of the present invention is used herein to illustrate the present invention, an aspect thereof, a feature thereof, a concept thereof, and/or an example thereof. A physical embodiment of an apparatus, an article of manufacture, a machine, and/or of a process that embodies the present invention may include one or more of the aspects, features, concepts, examples, etc. described with reference to one or more of the embodiments discussed herein. Further, from figure to figure, the embodiments may incorporate the same or similarly named functions, steps, modules, etc. that may use the same or different reference numbers and, as such, the functions, steps, modules, etc. may be the same or similar functions, steps, modules, etc. or different ones.

The above description provides specific details, such as material types and processing conditions to provide a thorough description of example embodiments. However, a person of ordinary skill in the art would understand that the embodiments may be practiced without using these specific details.

Some of the illustrative aspects of the present invention may be advantageous in solving the problems herein described and other problems not discussed which are discoverable by a skilled artisan. While the above description contains much specificity, these should not be construed as limitations on the scope of any embodiment, but as exemplifications of the presented embodiments thereof. Many other ramifications and variations are possible within the teachings of the various embodiments. While the invention has been described with reference to exemplary embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best or only mode contemplated for carrying out this invention, but that the invention will include all embodiments falling within the scope of the appended claims. Also, in the drawings and the description, there have been disclosed exemplary embodiments of the invention and, although specific terms may have been employed, they are unless otherwise stated used in a generic and descriptive sense only and not for purposes of limitation, the scope of the invention therefore not being so limited. Moreover, the use of the terms first, second, etc. do not denote any order or importance, but rather the terms first, second, etc. are used to distinguish one element from another. Furthermore, the use of the terms a, an, etc. do not denote a limitation of quantity, but rather denote the presence of at least one of the referenced item. Thus, the scope of the invention should be determined by the appended claims and their legal equivalents, and not by the examples given.

What is claimed is:

1. A method for linearizing digital-to-analog conversion comprising:
   receive, at a digital-to-analog converter (DAC) an input digital word;
   decompose the input digital word into a plurality of segments;
   generate a redundant representation of each of the plurality of segments;
   generate a redundant mapping of the redundant representation of each of the plurality of segments, defining a plurality of redundantly mapped segments;
   assigning a first probability for selecting the plurality of segments;
   assigning a second probability for selecting the plurality of redundantly mapped segments;
   selecting, with the first probability, the plurality of segments and, with the second probability, the plurality of redundantly mapped segments;
   converting the selected segments into analog signals by a plurality of sub-DACs; and
   combining the analog signals to define an output analog signal, wherein each of the plurality of segments is converted into an analog signal with a sub-DAC, wherein a resolution of each sub-DAC associated with intermediate segment pairs is at least one bit greater than the resolution of a sub-DAC for a first segment pair.

2. The method of claim 1, further comprising selecting between a plurality of mappings with probabilities of each mapping determined based on a number of bits of the DAC.

3. The method of claim 1, wherein performing the redundancy mapping comprises performing a recursive redundancy mapping sequentially over pairs of segments.

4. The method of claim 3, wherein each intermediate segment undergoes two mappings x_k→u_k→v_k, with a first mapping as a most-significant-bit (MSB) segment and a second mapping as a least significant bit (LSB) segment of a two-segment pair.

5. The method of claim 4, wherein a resolution of an MSB sub-DAC is unchanged and a resolution of all other sub-DACs is increased by at least one bit.

6. The method of claim 1, wherein the DAC is a B-bit binary DAC with B binary weighted elements.

7. The method of claim 1, wherein each of the plurality of segments is thermometer-coded.

8. The method of claim 1, wherein the DAC is at least one DAC selected from the group consisting of a binary DAC, a thermometer coded DAC, a dynamic element matching (DEM) DAC, and a segmented DAC.

9. A system for linearizing analog-to-digital conversion, comprising:
   a comparator positioned to receive an analog signal as a first input;
   a successive approximation register positioned to receive as an input an output of the comparator and configured to generate an output comprising B bits; and
   a digital-to-analog converter (DAC) configured to:
   receive, at a digital-to-analog converter (DAC) an input digital word;
   decompose the input digital word into a plurality of segments;
   generate a redundant representation of each of the plurality of segments;
   generate a redundant mapping of the redundant representation of each of the plurality of segments, defining a plurality of redundantly mapped segments;
   assigning a first probability for selecting the plurality of segments;
   assigning a second probability for selecting the plurality of redundantly mapped segments;
   selecting, with the first probability, the plurality of segments and with the second probability, the plurality of redundantly mapped segments;
   converting the selected segments into analog signals by a plurality of sub-DACs; and
   combining the analog signals to define an output analog signal, wherein each of the plurality of segments is converted into an analog signal with a sub-DAC, wherein a resolution of each sub-DAC associated with intermediate segment pairs is at least one bit greater than the resolution of a sub-DAC for a first segment pair.

10. The system of claim 9, further comprising selecting between a plurality of mappings with probabilities of each mapping determined based on a number of bits of the DAC.

11. The system of claim 9, wherein performing the redundancy mapping comprises performing a recursive redundancy mapping sequentially over pairs of segments.

12. The system of claim 11, wherein each intermediate segment undergoes two mappings x_k→u_k→v_k, with a first mapping as a most-significant-bit (MSB) segment and a second mapping as a least significant bit (LSB) segment of a two-segment pair.

13. The system of claim 12, wherein a resolution of an MSB sub-DAC is unchanged and a resolution of all other sub-DACs is increased by at least one bit.

14. The system of claim 9, wherein the DAC is a B-bit binary DAC with B binary weighted elements.

15. The system of claim 9, wherein each of the plurality of segments is thermometer-coded.

16. The system of claim 9, wherein the DAC is at least one DAC selected from the group consisting of a binary DAC, a thermometer coded DAC, a dynamic element matching (DEM) DAC, and a segmented DAC.

* * * * *